United States Patent
Satou et al.

(10) Patent No.: US 11,548,977 B2
(45) Date of Patent: Jan. 10, 2023

(54) ACTIVE ESTER RESIN AND COMPOSITION AND CURED PRODUCT USING THE SAME

(71) Applicant: DIC Corporation, Tokyo (JP)

(72) Inventors: Yutaka Satou, Ichihara (JP); Kazuhisa Yamoto, Ichihara (JP); Koji Hayashi, Ichihara (JP)

(73) Assignee: DIC Corporation, Tokyo (JP)

( * ) Notice: Subject to any disclaimer, the term of this patent is extended or adjusted under 35 U.S.C. 154(b) by 303 days.

(21) Appl. No.: 16/623,456

(22) PCT Filed: Apr. 24, 2018

(86) PCT No.: PCT/JP2018/016548
§ 371 (c)(1),
(2) Date: Dec. 17, 2019

(87) PCT Pub. No.: WO2018/235425
PCT Pub. Date: Dec. 27, 2018

(65) Prior Publication Data
US 2020/0216603 A1   Jul. 9, 2020

(30) Foreign Application Priority Data
Jun. 21, 2017   (JP) .............................. JP2017-121336

(51) Int. Cl.
| C08G 59/42 | (2006.01) |
| C08G 63/00 | (2006.01) |
| H01L 23/29 | (2006.01) |
| H05K 1/03 | (2006.01) |

(52) U.S. Cl.
CPC ......... *C08G 59/4223* (2013.01); *C08G 63/00* (2013.01); *H01L 23/295* (2013.01); *H05K 1/0373* (2013.01)

(58) Field of Classification Search
CPC .................................................. C08G 59/4223
See application file for complete search history.

(56) References Cited

U.S. PATENT DOCUMENTS

| 2015/0344617 A1 * | 12/2015 | Arita ..................... C08L 67/00 428/209 |
| 2017/0129837 A1 | 5/2017 | Onda |
| 2019/0225744 A1 * | 7/2019 | Kawasaki .......... C08G 59/4223 |

FOREIGN PATENT DOCUMENTS

| JP | 2012-246367 A | 12/2012 |
| JP | 2016-156019 A | 9/2016 |
| JP | 2017-088544 A | 5/2017 |
| TW | 201716363 A | 5/2017 |

OTHER PUBLICATIONS

International Search Report dated Jul. 24, 2018, issued for PCT/JP2018/016548.

* cited by examiner

*Primary Examiner* — Megan McCulley
(74) *Attorney, Agent, or Firm* — Locke Lord LLP; James E. Armstrong, IV; Nicholas J. DiCeglie, Jr.

(57) ABSTRACT

The present invention aims to provide a means by which a cured product to be obtained has a low dielectric loss tangent and higher heat resistance. Specifically, provided is an active ester resin that is a reaction product of a first aromatic compound having two or more phenolic hydroxy groups, a second aromatic compound having a phenolic hydroxy group, and a third aromatic compound having two or more carboxy groups and/or an acid halide thereof or an esterified compound thereof, in which at least one of the first aromatic compound, the second aromatic compound, and the third aromatic compound and/or the acid halide thereof or the esterified compound thereof has an unsaturated bond-containing substituent.

10 Claims, 2 Drawing Sheets

ACTIVE ESTER RESIN AND COMPOSITION AND CURED PRODUCT USING THE SAME

TECHNICAL FIELD

The present invention relates to an active ester resin and a composition and a cured product obtained using the active ester resin.

BACKGROUND ART

In recent years, electronic devices have been reduced in size and increased in performance, and accordingly, various materials used have been required to have higher performance. For example, in semiconductor package substrates, higher speeds and higher frequencies of signals are used, and materials having low electrical energy losses, i.e., low dielectric loss tangents, are required.

As such a material having a low dielectric loss tangent, for example, PTL 1 describes an invention relating to a resin composition containing (A) an epoxy resin, (B) an active ester compound, (C) a smear-suppressing component, and (D) an inorganic filler. In this case, the resin composition is characterized in that predetermined amounts of the active ester compound (B), the smear-suppressing component (C), and the inorganic filler (D) are contained based on 100% by mass of a non-volatile component in the resin composition and that the smear-suppressing component (C) is formed of rubber particles.

PTL 1 states that a cured product obtained from the resin composition can achieve a low dielectric loss tangent. It is also stated that a smear (resin residue) in a via hole can be suppressed after the cured product is subjected to drilling processing and then roughing treatment.

It is also stated that the active ester compound (B) described in PTL 1 is a compound having one or more active ester groups in one molecule and can reduce the dielectric loss tangent of the cured product of the resin composition.

CITATION LIST

Patent Literature

PTL 1: Japanese Unexamined Patent Application Publication No. 2016-156019

SUMMARY OF INVENTION

Technical Problem

PTL 1 states that the use of the active ester compound or the like can reduce the dielectric loss tangent of the resulting cured product. However, it has been found that such a cured product may not always have sufficient heat resistance.

Accordingly, it is an object of the present invention to provide a means by which a cured product to be obtained has a low dielectric loss tangent and higher heat resistance.

Solution to Problem

The inventors have conducted intensive studies to solve the foregoing problems and have found that the foregoing problems can be solved by the use of a predetermined active ester resin having an unsaturated bond-containing substituent. This finding has led to the completion of the present invention.

The present invention relates to an active ester resin that is a reaction product of a first aromatic compound having two or more phenolic hydroxy groups, a second aromatic compound having a phenolic hydroxy group, and a third aromatic compound having two or more carboxy groups and/or an acid halide thereof or an esterified compound thereof. In this case, at least one of the first aromatic compound, the second aromatic compound, and the third aromatic compound and/or the acid halide thereof or the esterified compound thereof has an unsaturated bond-containing substituent.

Advantageous Effects of Invention

According to the present invention, there is provided the active ester resin from which a cured product to be obtained has a low dielectric loss tangent and higher heat resistance.

DESCRIPTION OF EMBODIMENTS

Figure 1:
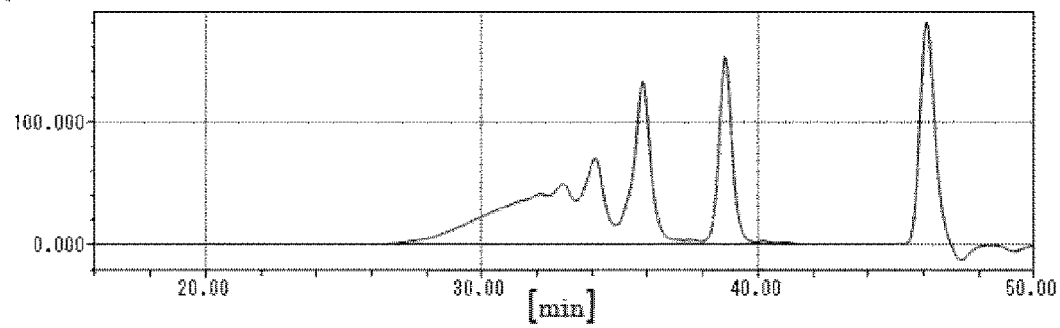
FIG. 1 is a GPC chart of an active ester resin obtained in Example 1.

Embodiments for carrying out the present invention will be described in detail below.

<Active Ester Resin>

An active ester resin according to an embodiment is a reaction product of a first aromatic compound having two or more phenolic hydroxy groups, a second aromatic compound having a phenolic hydroxy group, and a third aromatic compound having two or more carboxy groups and/or an acid halide thereof or an esterified compound thereof. In this case, at least one of the first aromatic compound, the second aromatic compound, and the third aromatic compound and/or the acid halide thereof or the esterified compound thereof has an unsaturated bond-containing substituent.

The use of the active ester resin can provide a cured product having a low dielectric loss tangent and higher heat resistance. Although the reason for this is not entirely clear, this is presumably due to the following reasons.

In the active ester resin according to the embodiment, the first aromatic compound has two or more phenolic hydroxy groups, and the third aromatic compound or the like has two or more carboxy groups and/or the structure of a derivative thereof, i.e., the structure of an acyl halide or an ester; thus, these compounds can be condensed to form polyester. The reaction of the second aromatic compound can terminate the condensation reaction. The resulting active ester resin has an ester bond that connects two aromatic rings. Such an ester bond has high reactivity with an epoxy group of an epoxy resin described below. The high reactivity can prevent or inhibit the formation of a hydroxy group due to the ring-opening of the epoxy group.

The active ester resin according to the embodiment has no or substantially no hydroxy group in its molecule. Thus, no or substantially no hydroxy group originating from the active ester resin is contained in a cured product obtained by the reaction of the active ester resin according to the embodiment.

Thus, in the case of the active ester resin according to the embodiment, it is possible to prevent or inhibit the formation of a hydroxy group at the time of curing. In general, hydroxy groups, which have high polarity, are known to increase the dielectric loss tangent. The use of the active ester resin according to the embodiment enables a cured product to have a low dielectric loss tangent.

The active ester resin according to the embodiment has two or more ester bonds each having reactivity with an epoxy group of an epoxy resin described below. This enables a cured product to have a higher cross-linking density to improve the heat resistance.

The active ester resin according to the embodiment has an unsaturated bond-containing substituent originating from the first aromatic compound, the second aromatic compound, and/or the third aromatic compound and so forth. This results in the formation of a cross-link based on the unsaturated bond-containing substituent as well as a cross-link based on an epoxy group and an ester bond, thereby enabling the achievement of a higher cross-linking density.

That is, because the active ester resin according to the embodiment has the unsaturated bond-containing substituent, a cured product to be obtained can have higher heat resistance.

Surprisingly, the presence of the unsaturated bond-containing substituent can reduce the dielectric loss tangent of a cured product to be obtained. Such an effect is presumed to be due to the fact that, for example, the presence of the unsaturated bond-containing substituent results in the resulting cured product having a low polarity in its entirety to reduce the loss of electrical energy.

Preferably, the active ester resin is a liquid at ordinary temperature (25° C.) or has a softening point in the range of 40° C. to 200° C., from the viewpoint of achieving better handleability when adjusted as a composition described below, and a better balance between the heat resistance and the dielectric properties of a cured product thereof.

[First Aromatic Compound]

The first aromatic compound has two or more phenolic hydroxy groups. Because two or more phenolic hydroxy groups are contained, the first aromatic compound can react with the third aromatic compound and so forth described below to form a polyester structure in the active ester resin.

Examples of the first aromatic compound include, but are not particularly limited to, compounds each containing two or more phenolic hydroxy groups on a substituted or unsubstituted first aromatic ring having 3 to 30 carbon atoms.

In this case, examples of the first aromatic ring having 3 to 30 carbon atoms include, but are not particularly limited to, monocyclic aromatic rings, fused aromatic rings, and aromatic ring assemblies.

Examples of the monocyclic aromatic rings include, but are not particularly limited to, benzene, furan, pyrrole, thiophene, imidazole, pyrazole, oxazole, isoxazole, thiazole, isothiazole, pyridine, pyrimidine, pyridazine, pyrazine, and triazine.

Examples of the fused aromatic rings include, but are not particularly limited to, naphthalene, anthracene, phenalene, phenanthrene, quinoline, isoquinoline, quinazoline, phthalazine, pteridine, coumarin, indole, benzimidazole, benzofuran, and acridine.

Examples of the aromatic ring assemblies include, but are not particularly limited to, biphenyl, binaphthalene, bipyridine, bithiophene, phenylpyridine, phenylthiophene, terphenyl, diphenylthiophene, and quaterphenyl.

The first aromatic ring having 3 to 30 carbon atoms may have a substituent. In this case, examples of the "substituent on the first aromatic ring" include, but are not particularly limited to, an alkyl group having 1 to 10 carbon atoms, an alkoxy group having 1 to 10 carbon atoms, halogen atoms, and unsaturated bond-containing substituents.

Examples of the alkyl group having 1 to 10 carbon atoms include, but are not particularly limited to, a methyl group, an ethyl group, a propyl group, an isopropyl group, a n-butyl group, an isobutyl group, a sec-butyl group, a tert-butyl group, a n-pentyl group, an isopentyl group, a tert-pentyl group, a neopentyl group, a 1,2-dimethylpropyl group, a n-hexyl group, an isohexyl group, a n-nonyl group, a cyclopropyl group, a cyclobutyl group, a cyclopentyl group, a cyclohexyl group, a cycloheptyl group, a cyclooctyl group, and a cyclononyl group.

Examples of the alkoxy group having 1 to 10 carbon atoms include, but are not particularly limited to, a methoxy group, an ethoxy group, a propoxy group, an isopropoxy group, a butoxy group, a pentyloxy group, a hexyloxy group, a 2-ethylhexyloxy group, an octyloxy group, and a nonyloxy group.

Examples of the halogen atoms include a fluorine atom, a chlorine atom, a bromine atom, and an iodine atom.

The unsaturated bond-containing substituent refers to a substituent having at least one unsaturated bond and preferably has 2 to 30 carbon atoms. In this case, the "unsaturated bond" refers to a double bond between carbon atoms or a triple bond between carbon atoms. Examples of the unsaturated bond-containing substituent include an alkenyl group having 2 to 30 carbon atoms and an alkynyl group having 2 to 30 carbon atoms.

Examples of the alkenyl group having 2 to 30 carbon atoms include, but are not particularly limited to, a vinyl group, an allyl group, a propenyl group, an isopropenyl group, a 1-propenyl group, a 1-butenyl group, a 2-butenyl group, a 3-butenyl group, a 1-hexenyl group, a 2-hexenyl group, a 3-hexenyl group, a 4-hexenyl group, a 5-hexenyl group, a 1-octenyl group, a 2-octenyl group, a 1-undecenyl group, a 1-pentaundecenyl group, a 3-pentadecenyl group, a 7-pentadecenyl group, a 1-octadecenyl group, a 2-octadecenyl group, a cyclopentenyl group, a cyclohexenyl group, a cyclooctenyl group, a 1,3-butadienyl group, a 1,4-butadienyl group, a hexa-1,3-dienyl group, a hexa-2,5-dienyl group, a pentadeca-4,7-dienyl group, a hexa-1,3,5-trienyl group, and a pentadeca-1,4,7-trienyl group.

Examples of the alkynyl group having 2 to 30 carbon atoms include, but are not particularly limited to an ethynyl group, a propargyl group, a 1-butynyl group, a 2-butynyl group, a 3-butynyl group, a 3-pentynyl group, a 4-pentynyl group, and a 1,3-butadiynyl group.

Among these, the unsaturated bond-containing substituent is preferably an alkenyl group having 2 to 30 carbon atoms, more preferably an alkenyl group having 2 to 10 carbon atoms, still more preferably an alkenyl group having 2 to 5 carbon atoms, even more preferably an allyl group, an isopropenyl group, or a 1-propenyl group, still even more preferably an allyl group. The unsaturated bond-containing substituent having 10 or less carbon atoms, preferably 2 to 5 carbon atoms is preferred because the cross-linked structure is dense and a cured product to be obtained can have higher heat resistance.

These substituents on the first aromatic ring may be contained alone or in combination of two or more.

As described above, the first aromatic compound is one in which at least two hydrogen atoms of the substituted or unsubstituted first aromatic ring are replaced with hydroxy groups.

Specific examples of the compound in which the first aromatic ring is a monocyclic aromatic ring (hereinafter, also referred to simply as a "first monocyclic aromatic ring compound") include catechol, resorcinol, hydroquinone, hydroxyquinol, phloroglucinol, pyrogallol, 2,3-dihydroxypyridine, 2,4-dihydroxypyridine, 4,6-dihydroxypyrimidine, 3-methylcatechol, 4-methylcatechol, and 4-allylpyrocatechol.

Specific examples of the compound in which the first aromatic ring is a fused aromatic ring (hereinafter, also referred to simply as a "first fused aromatic ring compound") include 1,3-naphthalenediol, 1,5-naphthalenediol, 2,7-naphthalenediol, 1,2,4-naphthalenetriol, 1,4,5-naphthalenetriol, 9,10-dihydroxyanthracene, 1,4,9,10-tetrahydroxyanthracene, 2,4-dihydroxyquinoline, 2,6-dihydroxyquinoline, 5,6-dihydroxyindole, and 2-methylnaphthalene-1,4-diol.

Specific examples of the compound in which the first aromatic ring is an aromatic ring assembly (hereinafter, also referred to simply as a "first aromatic ring assembly compound") include 2,2'-dihydroxybiphenyl, 4,4'-dihydroxybiphenyl, 3,4,4'-trihydroxybiphenyl, and 2,2',3-trihydroxybiphenyl.

The first aromatic compound may have a structure in which the first aromatic rings are linked by a linking group. The first aromatic compound according to an embodiment is represented by chemical formula (1) below.

[Chem. 1]

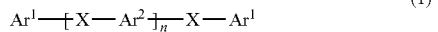

(1)

In chemical formula (1), each $Ar^1$ is independently a substituted or unsubstituted first aromatic ring group having 3 to 30 carbon atoms, each $Ar^2$ is independently a substituted or unsubstituted second aromatic ring group, having 3 to 30 carbon atoms, each X is independently an oxygen atom, a sulfur atom, a substituted or unsubstituted alkylene, a substituted or unsubstituted cycloalkylene, or a substituted or unsubstituted aralkylene, and n is 0 to 10. In this case, at least two hydrogen atoms of $Ar^1$ and $Ar^2$ are replaced with hydroxy groups. Each X corresponds to the linking group.

Each $Ar^1$ is the substituted or unsubstituted first aromatic ring group and preferably has 3 to 30 carbon atoms. As is clear from the description of chemical formula (1), one of the hydrogen atoms of the aromatic ring in the substituted or unsubstituted aromatic ring is bonded to "X".

Examples of the first aromatic ring group having 3 to 30 carbon atoms include, but are not particularly limited to, a group in which one hydrogen atom is removed from an aromatic compound, such as a group in which one hydrogen atom is removed from a monocyclic aromatic compound, e.g., benzene, furan, pyrrole, thiophene, imidazole, pyrazole, oxazole, isoxazole, thiazole, isothiazole, pyridine, pyrimidine, pyridazine, pyrazine, or triazine, and a group in which one hydrogen atom is removed from a fused aromatic compound, e.g., naphthalene, anthracene, phenalene, phenanthrene, quinoline, isoquinoline, quinazoline, phthalazine, pteridine, coumarin, indole, benzimidazole, benzofuran, or acridine. Additionally, the first aromatic ring group may be a combination of a plurality of these aromatic compounds. An example thereof is a group in which one hydrogen atom is removed from an aromatic ring assembly compound, such as biphenyl, binaphthalene, bipyridine, bithiophene, phenylpyridine, phenylthiophene, terphenyl, diphenylthiophene, or quaterphenyl.

In this case, the first aromatic ring group may have a substituent. Examples of the "substituent on the first aromatic ring group" include the same as those of the "substituent on the first aromatic ring" described above.

Among these, $Ar^1$ is preferably a group in which one hydrogen atom is removed from benzene, naphthalene, anthracene, phenalene, phenanthrene, biphenyl, binaphthalene, quaterphenyl, allylbenzene, diallylbenzene, allylnaphthalene, diallylnaphthalene, allylbiphenyl, or diallylbiphenyl, more preferably a group in which one hydrogen atom is removed from benzene, naphthalene, biphenyl, allylbenzene, diallylnaphthalene, or diallylbiphenyl.

Each $Ar^2$ is independently a substituted or unsubstituted second aromatic ring group and preferably has 3 to 30 carbon atoms. As is clear from the description of chemical formula (1), two hydrogen atoms of the aromatic ring in the substituted or unsubstituted aromatic ring are bonded to "X".

Examples of the second aromatic ring group having 3 to 30 carbon atoms include, but are not particularly limited to, a group in which two hydrogen atoms are removed from an aromatic compound, such as a group in which two hydrogen atoms are removed from a monocyclic aromatic compound, e.g., benzene, furan, pyrrole, thiophene, imidazole, pyrazole, oxazole, isoxazole, thiazole, isothiazole, pyridine, pyrimidine, pyridazine, pyrazine, or triazine, and a group in which two hydrogen atoms are removed from a fused aromatic compound, e.g., naphthalene, anthracene, phenalene, phenanthrene, quinoline, isoquinoline, quinazoline, phthalazine, pteridine, coumarin, indole, benzimidazole, benzofuran, or acridine. Additionally, the second aromatic ring group may be a combination of a plurality of these aromatic compounds. An example thereof is a group in which two hydrogen atoms are removed from an aromatic ring assembly compound, such as biphenyl, binaphthalene, bipyridine, bithiophene, phenylpyridine, phenylthiophene, terphenyl, diphenylthiophene, or quaterphenyl.

In this case, the second aromatic ring group may have a substituent. Examples of the "substituent on the second aromatic ring group" include the same as those of the "substituent on the first aromatic ring" described above.

Each X described above is independently an oxygen atom, a sulfur atom, a substituted or unsubstituted alkylene, a substituted or unsubstituted cycloalkylene, or a substituted or unsubstituted aralkylene.

The alkylene preferably, but not necessarily, has 1 to 20 carbon atoms. Examples thereof include methylene, ethylene, propylene, 1-methylmethylene, 1,1-dimethylmethylene, 1-methylethylene, 1,1-dimethylethylene, 1,2-dimethylethylene, propylene, butylene, 1-methylpropylene, 2-methylpropylene, pentylene, and hexylene.

The cycloalkylene preferably, but not necessarily, has 3 to 20 carbon atoms. Examples thereof include cyclopropylene, cyclobutylene, cyclopentylene, cyclohexylene, cyclopentylene, cycloheptylene, and cycloalkylenes represented by chemical formulae (1-1) to (1-4) below.

[Chem. 2]

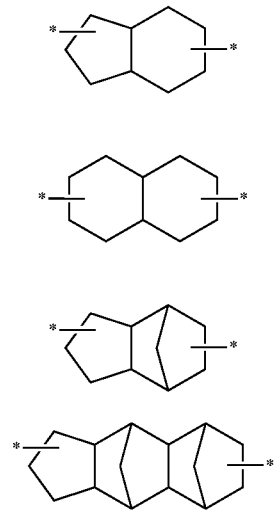

(1-1)
(1-2)
(1-3)
(1-4)

In chemical formulae (1-1) to (1-4), each "*" represents a site that binds to $Ar^1$ or $Ar^2$.

The aralkylene preferably, but not necessarily, has 8 to 20 carbon atoms. Examples thereof include aralkylenes represented by chemical formulae (2-1) to (2-8) below.

[Chem. 3]

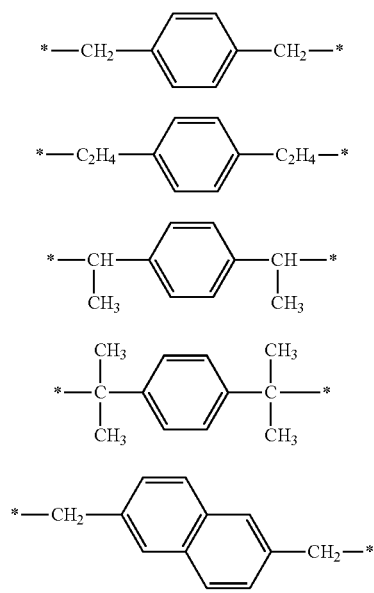

(2-1)
(2-2)
(2-3)
(2-4)
(2-5)

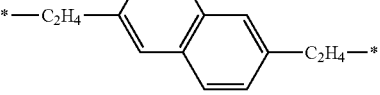

(2-6)

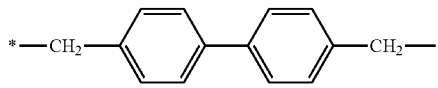

(2-7)

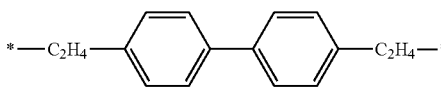

(2-8)

wherein in chemical formulae (2-1) to (2-8), each "*" represents a site that binds to $Ar^1$ or $Ar^2$.

Each of the alkylene, the cycloalkylene, and the aralkylene may have a substituent. In this case, examples of the "substituent on X" include the same as those of the "substituent on the first aromatic ring" described above.

Among those described above, X is preferably a substituted or unsubstituted cycloalkylene having 1 to 20 carbon atoms or an aralkylene having 8 to 20 carbon atoms, more preferably a substituted or unsubstituted cycloalkylene having 1 to 20 carbon atoms, even more preferably a cycloalkylene represented by formula (1-3) or (1-4). Preferably, X is a substituted or unsubstituted cycloalkylene having 1 to 20 carbon atoms or an aralkylene having 8 to 20 carbon atoms because the increase of a non-polar moiety results in a lower dielectric loss tangent of a cured product to be obtained and because the long distance between cross-linking points can result in a reduction in internal stress to increase the adhesion. More preferably, X is a substituted or unsubstituted cycloalkylene having 1 to 20 carbon atoms because a lower polarity results in an even lower dielectric loss tangent of a cured product to be obtained and because the adhesion can be further increased.

n is an integer of 0 to 10, preferably 0 to 8, preferably 0 to 5. When the compound represented by chemical formula (1) is an oligomer or a polymer, n represents an average value.

At least two hydrogen atoms of $Ar^1$ and $Ar^2$ are replaced with hydroxy groups.

Specific examples of the compound represented by chemical formula (1) include, but are not particularly limited to, bisphenol A, bisphenol AP, bisphenol B, bisphenol E, bisphenol F, bisphenol Z, and compounds represented by chemical formulae (3-1) to (3-9).

[Chem. 4]

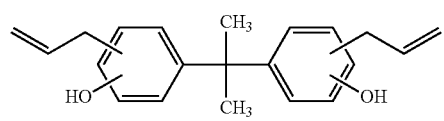

(3-1)

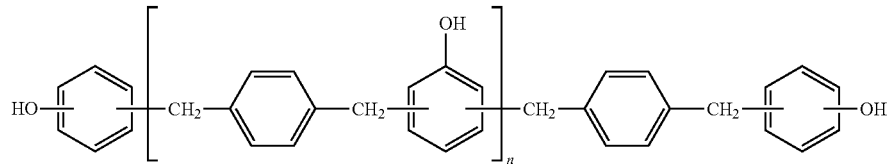
(3-2)

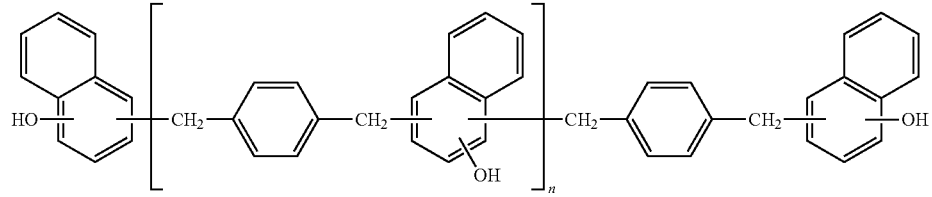
(3-3)

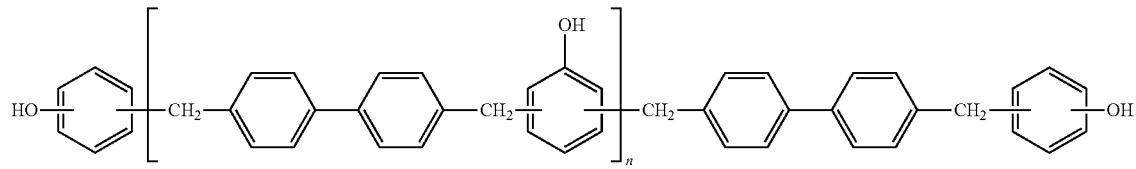
(3-4)

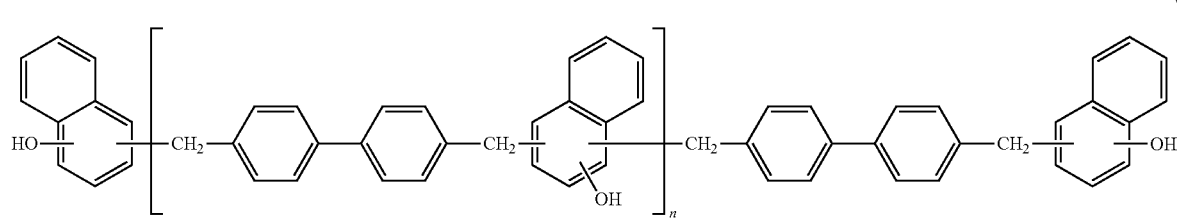
(3-5)

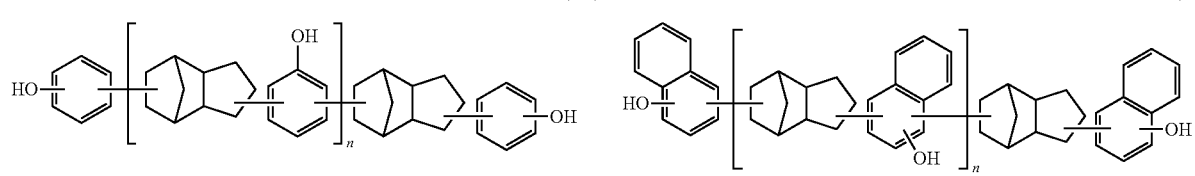

(3-6)
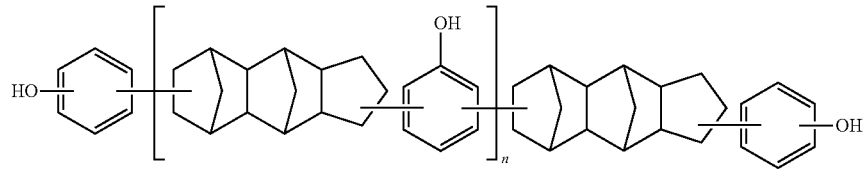

(3-7)

(3-8)
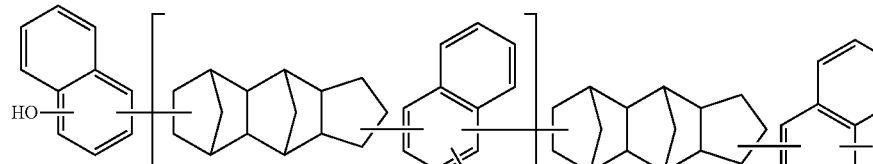

(3-9)

In chemical formulae (3-1) to (3-9), n is 0 to 10, preferably 0 to 5. In this case, when the compound represented by one of chemical formulae (3-1) to (3-9) is an oligomer or a polymer, n represents an average value. In the present specification, the "oligomer" refers to a compound having 1 to 5 repeat units, and the "polymer" refers to a compound having 6 or more repeat units. The substitution positions of the hydroxy groups that are substituents on the aromatic rings may be freely selected. In the case of each of the naphthalene rings, each hydroxy group may be attached to either a ring that binds to another moiety or a ring that does not bind to another moiety.

In an embodiment, the first aromatic ring represented by chemical formula (1) can be synthesized by the reaction of a divinyl compound with a compound in which at least one hydrogen atom of the first aromatic ring is replaced with a hydroxy group.

In this case, examples of the divinyl compound include, but are not particularly limited to, aliphatic diene compounds, such as 1,3-butadiene, 1,5-hexadiene, tricyclopentadiene, tetracyclopentadiene, pentacyclopentadiene, and hexacyclopentadiene; aromatic diene compounds, such as divinylbenzene and divinylbiphenyl; and alkoxymethyl compounds, such as dimethoxymethylbenzene, dimethoxymethylbiphenyl, methoxy adducts of bisphenol A, ethoxy adducts of bisphenol A, methoxy adducts of bisphenol F, and ethoxy adducts of bisphenol F.

Among those described above, the first aromatic compound is preferably a compound represented by chemical formula (1), preferably bisphenol A, bisphenol E, or a compound represented by any of formulae (3-1) to (3-4), more preferably a compound represented by formula (3-3) or (3-4).

These first aromatic compounds each having two or more phenolic hydroxy groups may be used alone or in combination of two or more.

The first aromatic compound preferably has a hydroxyl equivalent of 130 to 500 g/equivalent, more preferably 130 to 400 g/equivalent. A hydroxyl equivalent of 130 g/equivalent or more of the first aromatic compound results in higher heat resistance of a cured product to be obtained and is thus preferred. A hydroxyl equivalent of 500 g/equivalent or less of the first aromatic compound results in a better balance between the heat resistance and the dielectric loss tangent of a cured product to be obtained and is thus preferred.

In the case where the first aromatic compound is represented by chemical formula (1) and where n corresponds to an oligomer or a polymer, the weight-average molecular weight is preferably 200 to 3,000, more preferably 200 to 2,000. A weight-average molecular weight of 200 or more of the first aromatic compound results in a better dielectric loss tangent of a cured product to be obtained and is thus preferred. A weight-average molecular weight of 3,000 or less of the first aromatic compound results in good formability and is thus preferred. As the value of the "weight-average molecular weight" in the present specification, a value measured by a method described below is used. Specifically, a value obtained by gel permeation chromatography (GPC) measurement under conditions below is used.

Measurement Conditions of GPC
Measurement instrument: "HLC-8320 GPC", available from Tosoh Corporation
Column: guard column "HXL-L", available from Tosoh Corporation
+"TSK-GEL G4000HXL", available from Tosoh Corporation
+"TSK-GEL G3000HXL", available from Tosoh Corporation
+"TSK-GEL G2000HXL", available from Tosoh Corporation
+"TSK-GEL G2000HXL", available from Tosoh Corporation
Detector: RI (differential refractometer)
Data processing: "GPC Workstation EcoSEC-WorkStation", available from Tosoh Corporation
Column temperature: 40° C.
Developing solvent: tetrahydrofuran
Flow rate: 1.0 ml/minute
Standard: monodisperse polystyrenes having known molecular weights, described below, were used in accordance with the measurement manual of "GPC-8320 GPC".
Polystyrene used:
"A-500", available from Tosoh Corporation
"A-1,000", available from Tosoh Corporation
"A-2,500", available from Tosoh Corporation
"A-5,000", available from Tosoh Corporation
"F-1", available from Tosoh Corporation
"F-2", available from Tosoh Corporation
"F-4", available from Tosoh Corporation
"F-10", available from Tosoh Corporation
"F-20", available from Tosoh Corporation
"F-40", available from Tosoh Corporation
"F-80", available from Tosoh Corporation
"F-128", available from Tosoh Corporation
Sample: a filtrate (50 μl) obtained by filtering a 1.0% by mass solution in tetrahydrofuran with a microfilter in terms of the resin solid content

[Second Aromatic Compound]

The second aromatic compound has a phenolic hydroxy group. The second aromatic compound has one phenolic hydroxy group and thus has the function of terminating the polyesterification reaction of the foregoing first aromatic compound, and the third aromatic compound and so forth, described below.

Examples of the second aromatic compound include, but are not particularly limited to, compounds each containing one phenolic hydroxy group on a substituted or unsubstituted second aromatic ring having 3 to 30 carbon atoms.

Examples of the second aromatic ring having 3 to 30 carbon atoms include, but are not particularly limited to, monocyclic aromatic rings, fused aromatic rings, aromatic ring assemblies, and aromatic rings linked by an alkylene. Examples of the monocyclic aromatic rings, the fused aromatic rings, and the aromatic ring assemblies include the same as those of the first aromatic ring described above.

Examples of the aromatic rings linked by an alkylene include diphenylmethane, diphenylethane, 1,1-diphenylethane, 2,2-diphenylpropane, naphthylphenylmethane, triphenylmethane, dinaphthylmethane, dinaphthylpropane, phenylpyridylmethane, fluorene, and diphenylcyclopentane.

The second aromatic ring having 3 to 30 carbon atoms in the second aromatic compound may have a substituent. In this case, examples of the "substituent on the second aromatic ring" include the same as those of the "substituent on the first aromatic ring" described above.

As described above, one hydrogen atom on the substituted or unsubstituted second aromatic ring having 3 to 30 carbon atoms in the second aromatic compound is replaced with a hydroxy group.

Examples of the second aromatic compound include compounds represented by chemical formulae (4-1) to (4-17) below.

[Chem. 5]

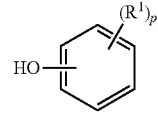

(4-1)

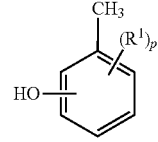

(4-2)

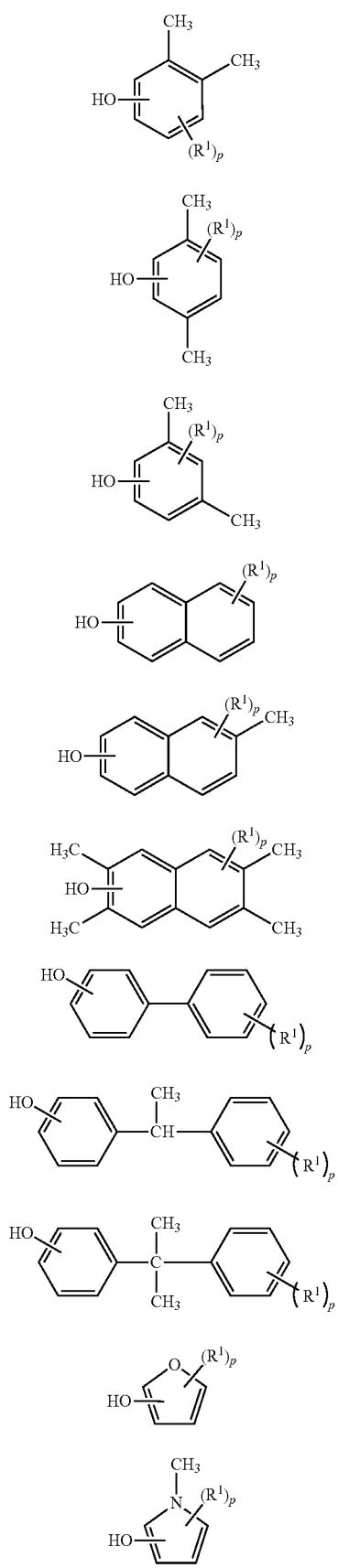

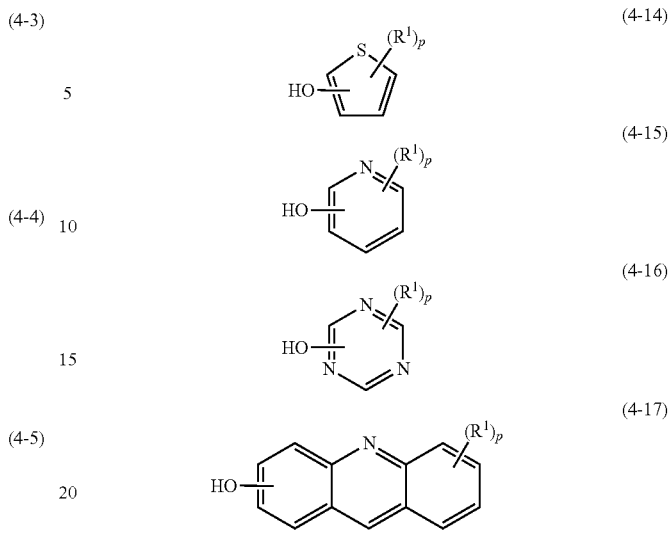

In chemical formulae (4-1) to (4-17), each $R^1$ is an unsaturated bond-containing substituent. In this case, the unsaturated bond-containing substituent is the same as described above. Each p is an integer of 0 or 1 or more, preferably 1 to 3, more preferably 1 or 2, even more preferably 1. In the case where p is 2 or more, binding positions on an aromatic ring are freely selected. For example, in the cases of the naphthalene ring in chemical formula (4-6) and the heterocyclic ring in chemical formula (4-17), any ring may be substituted. In the case of chemical formula (4-9) or the like, any of the benzene rings present in one molecule may be substituted. The number of substituents in one molecule is p.

Specific examples of the second aromatic compound include, but are not particularly limited to, compounds each including a monocyclic aromatic ring serving as the aromatic ring (hereinafter, also referred to simply as "second monocyclic aromatic ring compounds), such as phenol, cresol, xylenol, o-allylphenol, m-allylphenol, p-allylphenol, 2,4-diallylphenol, 2,6-diallylphenol, 2-allyl-4-methylphenol, 2-allyl-6-methylphenol, 2-allyl-4-methoxy-6-methylphenol, 2-propargylphenol, 3-propargylphenol, and 4-propargylphenol; compounds each including a fused aromatic ring serving as the aromatic ring (hereinafter, also referred to simply as "second fused aromatic ring compounds"), such as 1-naphthol, 2-naphthol, 2-allyl-1-naphthol, 3-allyl-1-naphthol, 1-allyl-2-naphthol, 3-allyl-2-naphthol, 5-allyl-1-naphthol, 6-allyl-1-naphthol, diallylnaphthol, 2-allyl-4-methoxy-1-naphthol, 2-propargyl-1-naphthol, 3-propargyl-1-naphthol, 1-propargyl-2-naphthol, and 3-propargyl-2-naphthol; and compounds each including an aromatic ring assembly serving as the aromatic ring (hereinafter, also referred to simply as a "second aromatic ring assembly compound"), such as allylhydroxybiphenyl and hydroxypropargylbiphenyl.

Among those described above, the second aromatic compound is preferably the second monocyclic aromatic ring compound or the second fused aromatic ring compound, more preferably o-allylphenol, m-allylphenol, p-allylphenol, 2-allyl-1-naphthol, 3-allyl-1-naphthol, 1-allyl-2-naphthol, 3-allyl-2-naphthol, 5-allyl-1-naphthol, or 6-allyl-1-naphthol.

The second aromatic compound according to another embodiment is preferably the second fused aromatic ring compound (fused aromatic ring compound), more preferably 2-allyl-1-naphthol, 3-allyl-1-naphthol, 1-allyl-2-naphthol, 3-allyl-2-naphthol, 5-allyl-1-naphthol, or 6-allyl-1-naphthol. In the case where the second aromatic compound is the fused aromatic ring compound, the suppression of molecular motion due to steric hindrance can result in a lower dielectric loss tangent of a cured product to be obtained, which is preferred. From the viewpoint of achieving high handleability and low viscosity of an ester resin to be obtained, for example, 2-allylphenol having a benzene ring skeleton is preferred. From the viewpoint of enabling the resulting cured product to have higher heat resistance and a good balance with low dielectric properties, for example, 2-allyl-1-naphthol or 1-allyl-2-naphthol having a naphthalene ring skeleton is preferred.

These second aromatic compounds may be used alone or in combination of two or more.

[Third Aromatic Compound and/or Acid Halide Thereof or Esterified Compound Thereof]

The third aromatic compound and/or an acid halide thereof or an esterified compound thereof is a carboxylic acid having two or more carboxy groups or a derivative thereof, such as an acid halide or an esterified compound (in the present specification, the third aromatic compound and/or an acid halide thereof or an esterified compound thereof is also referred to collectively as a "third aromatic compound and so forth"). The third aromatic compound and so forth have two or more carboxy groups and so forth and thus can react with the first aromatic compound to form a polyester structure in the active ester resin. Note that a reaction with the second aromatic compound terminates the polyesterification reaction.

Examples of the third aromatic compound and so forth include, but are not particularly limited to, compounds each containing two or more carboxy groups and so forth on a substituted or substituted third aromatic ring having 3 to 30 carbon atoms.

Examples of the "carboxy groups and so forth" include a carboxy group; acyl halide groups, such as acyl fluoride groups, acyl chloride groups, and acyl bromide groups; alkyloxycarbonyl groups, such as a methyloxycarbonyl group and an ethyloxycarbonyl group; and aryloxycarbonyl groups, such as a phenyloxycarbonyl group and a naphthyloxycarbonyl group. When an acyl halide group is contained, the third aromatic compound is an acid halide. When an alkyloxycarbonyl group or an aryloxycarbonyl group is contained, the third aromatic compound can be an esterified compound. Among these, the third aromatic compound preferably has a carboxy group, an acyl halide group, or an aryloxycarbonyl group, more preferably a carboxy group or an acyl halide group, even more preferably a carboxy group, an acyl chloride group, or an acyl bromide group.

Examples of the third aromatic compound and so forth include, but are not particularly limited to, compounds each containing two or more carboxy groups and so forth on the substituted or unsubstituted third aromatic ring having 3 to 30 carbon atoms.

Examples of the third aromatic ring having 3 to 30 carbon atoms include, but are not particularly limited to, monocyclic aromatic rings, fused aromatic rings, aromatic ring assemblies, and aromatic rings linked by an alkylene. Examples of the monocyclic aromatic rings, the fused aromatic rings, the aromatic ring assemblies, and the aromatic rings linked by an alkylene include the same as those of the first aromatic ring and the second aromatic ring.

The third aromatic ring having 3 to 30 carbon atoms according to the third aromatic compound and so forth may have a substituent. In this case, examples of the "substituent of the third aromatic ring" include the same as those of the "substituent on the first aromatic ring" described above.

Specific examples of the third aromatic compound and so forth include compounds represented by chemical formulae (5-1) to (5-15) below.

[Chem. 6]

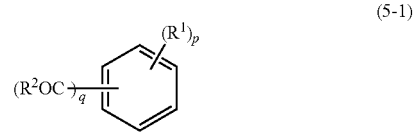

(5-1)

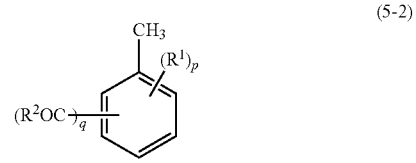

(5-2)

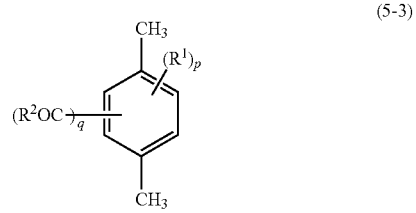

(5-3)

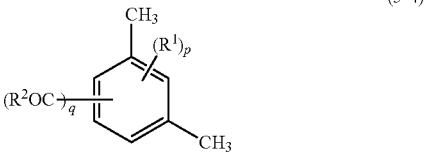

(5-4)

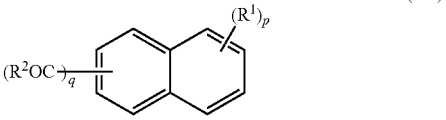

(5-5)

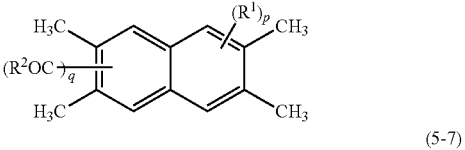

(5-6)

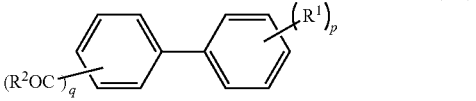

(5-7)

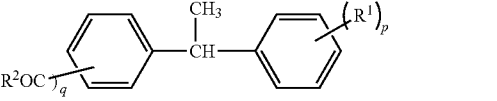

(5-8)

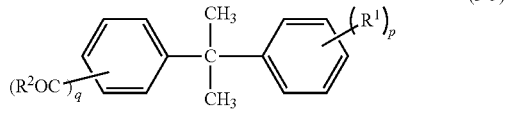

(5-9)

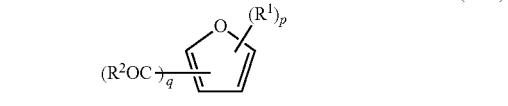

(5-10)

(5-11)
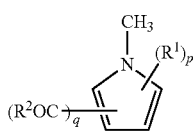

(5-12)
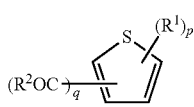

(5-13)
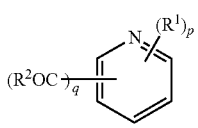

(5-14)
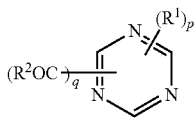

(5-15)

In chemical formulae (5-1) to (5-15), each $R^1$ is an unsaturated bond-containing substituent. In this case, the unsaturated bond-containing substituent is the same as described above. Each $R^2$ is a hydroxy group, a halogen atom, an alkyloxy group, or an aryloxy group. p is an integer of 0 or 1 or more, preferably 0 or 1 to 3, more preferably 0 or 1, even more preferably 0. q is 2 or 3. In the case where each of p and q is 2 or more, binding positions on an aromatic ring are freely selected. For example, in the cases of the naphthalene ring in chemical formula (5-5) and the heterocyclic ring in chemical formula (5-15), any ring may be substituted. In the case of chemical formula (5-7) or the like, any of the benzene rings present in one molecule may be substituted. The number of substituents in one molecule is p and q.

Specific examples of the third aromatic compound and so forth include, but are not particularly limited to, benzenedicarboxylic acids, such as isophthalic acid, terephthalic acid, 5-allylisophthalic acid, and 2-allylterephthalic acid; benzenetricarboxylic acids, such as trimellitic acid and 5-allyltrimellitic acid; naphthalenedicarboxylic acids, such as naphthalene-1,5-dicarboxylic acid, naphthalene-2,3-dicarboxylic acid, naphthalene-2,6-dicarboxylic acid, naphthalene-2,7-dicarboxylic acid, 3-allylnaphthalene-1,4-dicarboxylic acid, and 3,7-diallylnaphthalene-1,4-dicarboxylic acid; pyridinetricarboxylic acids, such as 2,4,5-pyridinetricarboxylic acid; triazinecarboxylic acids, such as 1,3,5-triazine-2,4,6-tricarboxylic acid; acid halides thereof; and esterified compounds thereof. Among these, the third aromatic compound and so forth are preferably benzenedicarboxylic acid or benzenetricarboxylic acid, more preferably isophthalic acid, terephthalic acid, isophthaloyl chloride, terephthaloyl chloride, 1,3,5-benzenetricarboxylic acid, or 1,3,5-benzenetricarbonyl trichloride, even more preferably isophthaloyl chloride, terephthaloyl chloride, or 1,3,5-benzenetricarbonyl trichloride.

Among those described above, the third aromatic compound and so forth preferably have a monocyclic aromatic ring as the aromatic ring, and the third aromatic compound and so forth preferably have a fused aromatic ring as the aromatic ring. Benzenedicarboxylic acid, benzenetricarboxylic acid, naphthalenedicarboxylic acid, or an acid halide thereof is preferred. Benzenedicarboxylic acid, naphthalenedicarboxylic acid, or an acid halide thereof is more preferred. Isophthalic acid, terephthalic acid, naphthalene-1,5-dicarboxylic acid, naphthalene-2,3-dicarboxylic acid, naphthalene-2,6-dicarboxylic acid, naphthalene-2,7-dicarboxylic acid, or an acid halide thereof is even more preferred.

These third aromatic compound and so forth described above may be used alone or in combination of two or more.

[Structure of Active Ester Resin]

At least one of the first aromatic compound, the second aromatic compound, and the third aromatic compound and/or the acid halide thereof or the esterified compound thereof (third aromatic compound and so forth) has an unsaturated bond-containing substituent. The substituent preferably has 2 to 30 carbon atoms. That is, each of the first aromatic compound, the second aromatic compound, and the third aromatic compound and so forth may have the unsaturated bond-containing substituent. Each of the first aromatic compound and the second aromatic compound may have the unsaturated bond-containing substituent. Only the second aromatic compound may have the unsaturated bond-containing substituent. In the case where two or more types of the first aromatic compound, the second aromatic compound, and the third aromatic compound are used, only a subset thereof may have the unsaturated bond-containing substituent.

At least the second aromatic compound according to an embodiment preferably has the unsaturated bond-containing substituent. As described above, a structure originating from the second aromatic compound is located at a molecular end of the active ester resin. As a result, the unsaturated bond-containing substituent of the second aromatic compound is also arranged at the molecular end of the active ester resin. This is preferred because the balance between the heat resistance and the dielectric loss tangent of a cured product to be obtained can be further increased.

The active ester resin, as described above, is a reaction product of the first aromatic compound, the second aromatic compound, and the third aromatic compound and can contain various compounds. The structure of the active ester resin can be controlled by, for example, appropriately changing the amounts of the first aromatic compound, the second aromatic compound, and the third aromatic compound used and reaction conditions.

In principle, the active ester resin according to the embodiment does not have a hydroxy group in the molecule of a resin to be obtained. However, a hydroxy group-containing compound may be contained as a by-product in reaction products as long as the effect of the present invention is not inhibited.

The active ester resin according to an embodiment contains a compound represented by chemical formula (6) below.

[Chem. 7]

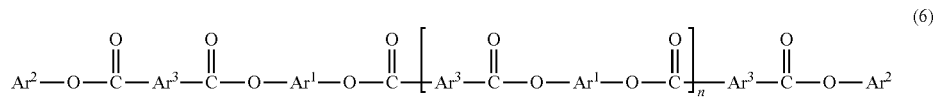

(6)

In chemical formula (6), each $Ar^1$ has a structure originating from the first aromatic compound, each $Ar^2$ has a structure originating from the second aromatic compound, and $Ar^3$ has a structure originating from the third aromatic compound. n is 0 to 10. When the active ester resin is an oligomer or a polymer, n represents an average value.

For example, each $Ar^1$ is independently a group in which two or more hydrogen atoms are removed from the substituted or unsubstituted first aromatic ring or a group in which two or more hydrogen atoms are removed from a structure in which the first aromatic rings are linked by a linking group.

For example, each $Ar^2$ is independently a group in which one hydrogen atom is removed from the substituted or unsubstituted second aromatic ring.

For example, each $Ar^3$ is a group in which two or more hydrogen atoms are removed from the substituted or unsubstituted third aromatic ring.

At least one of $Ar^1$, $Ar^2$, and $Ar^3$ has an unsaturated bond-containing substituent.

In this case, when the first aromatic compound has three or more phenolic hydroxy groups, each $Ar^1$ can have a more branched structure.

When the third aromatic compound has two or more carboxy groups, each $Ar^3$ can have a more branched structure.

Examples of a compound contained in the active ester resin according to an embodiment include compounds represented by chemical formulae (7-1) to (7-10) below.

[Chem. 8]

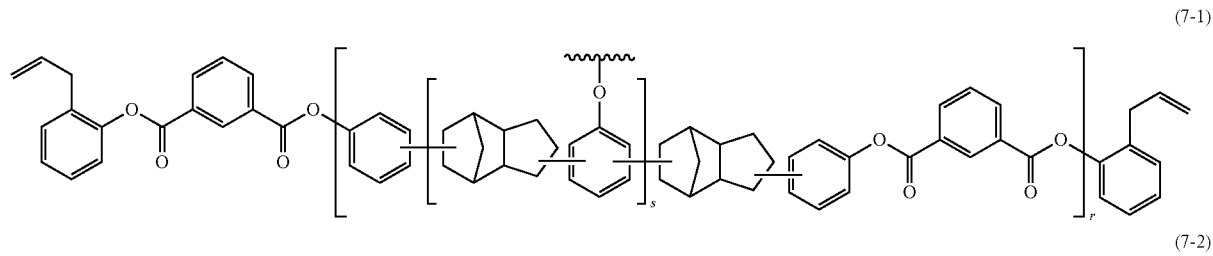

(7-1)

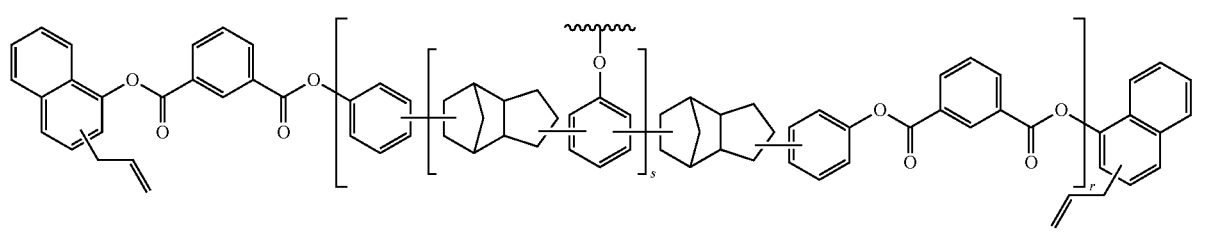

(7-2)

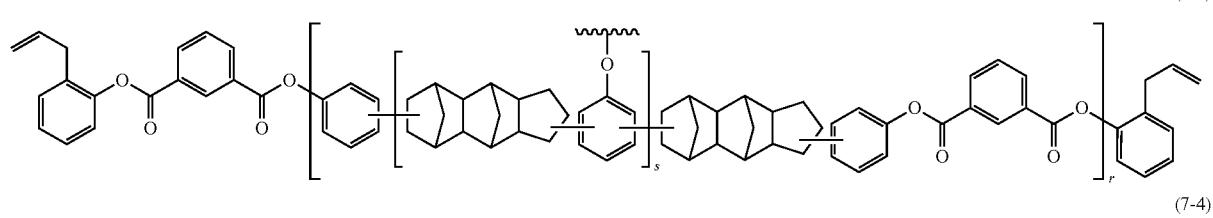

(7-3)

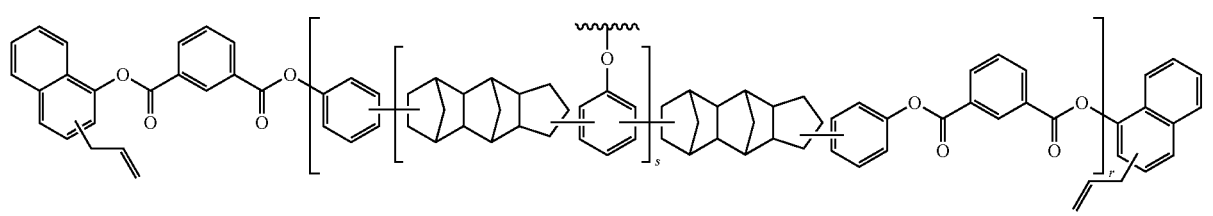

(7-4)

(7-5)

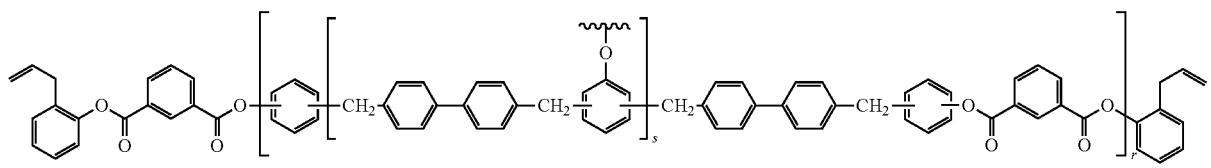

[Chem. 9]

(7-6)

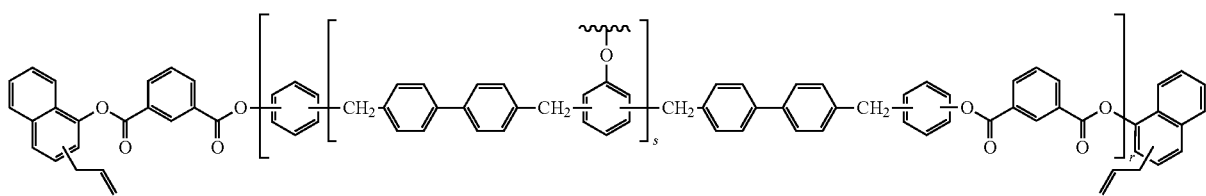

(7-7)

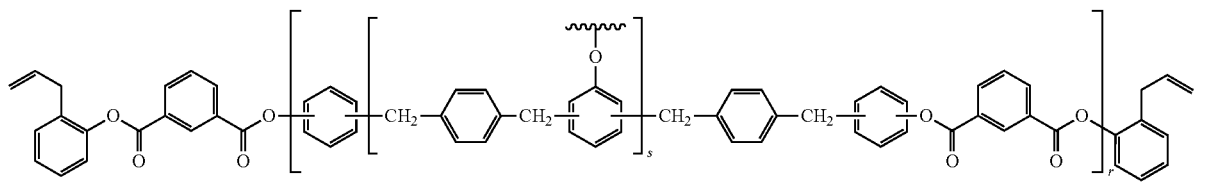

(7-8)

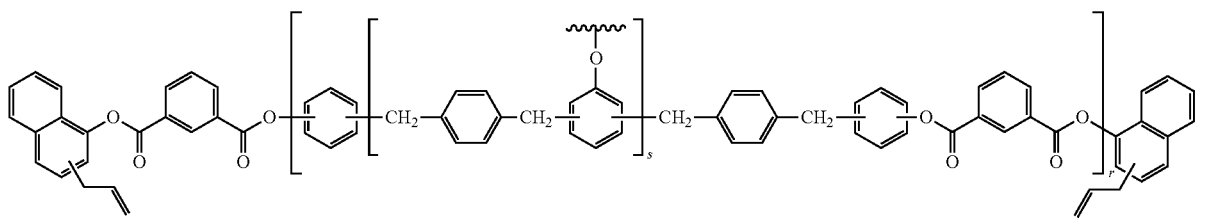

[Chem. 10]

(7-9)

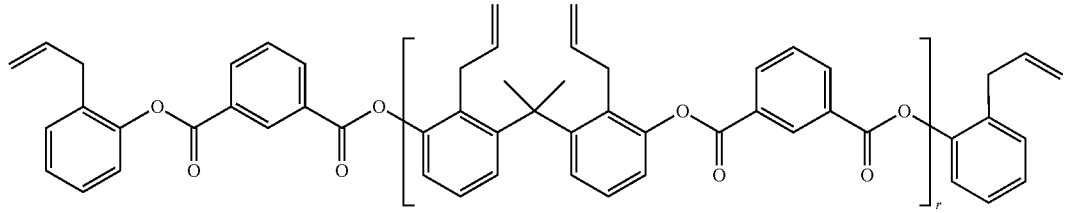

(7-10)

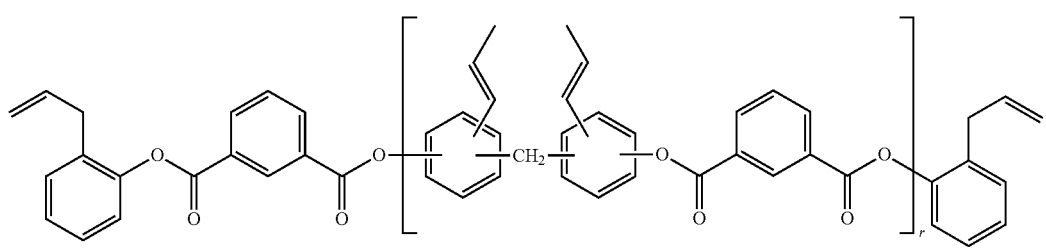

In chemical formulae (7-1) to (7-10), s is 0 to 10, preferably 0 to 5, and r is 1 to 10. When the compound represented by each of chemical formulae (7-1) to (7-10) is an oligomer or a polymer, s1, s2, and r each represent an average value. Broken lines in the chemical formulae represent structures obtained by the reaction of a compound corresponding to $Ar^3$ with a compound corresponding to $Ar^1$ and/or $Ar^2$.

Among the chemical formulae (7-1) to (7-10), chemical formulae (7-1) to (7-8) are preferred, and chemical formulae (7-1) to (7-4) are more preferred.

The active ester resin according to the present invention preferably has a weight-average molecular weight of 150 to 3,000, more preferably 200 to 2,000. A weight-average molecular weight of 800 or more results in a good dielectric loss tangent and is thus preferred. A weight-average molecular weight of 500 or less results in good formability and is thus preferred. The active ester resin preferably has a number-average molecular weight of 150 to 1,500 because of the same reasons.

<Method for Producing Active Ester Resin>

A method for producing the active ester resin is not particularly limited. The active ester resin can be produced by an appropriate known method.

The method according to an embodiment for producing the active ester resin includes a step of reacting the first aromatic compound, the second aromatic compound, and the third aromatic compound.

(First Aromatic Compound, Second Aromatic Compound, and Third Aromatic Compound)

As the first aromatic compound, the second aromatic compound, and the third aromatic compound, those described above are used.

Among the aromatic compounds described above, in particular, a compound that dissolves uniformly in an aromatic hydrocarbon-based solvent in a concentration of 10% or more by mass is preferably used as the first aromatic compound. In particular, a compound that dissolves uniformly in toluene or xylene is more preferably used as a raw material in view of ease of the production of the active ester resin according to the present invention and ease of adjustment when adjusted as a composition.

In an embodiment, the structure of the resulting active ester resin can be controlled by appropriately adjusting the amounts of the first aromatic compound, the second aromatic compound, and the third aromatic compound used.

For example, the ratio of the number of moles of the carboxy groups and so forth of the third aromatic compound to the number of moles of the hydroxy groups of the first aromatic compound (carboxy groups and so forth/hydroxy groups of first aromatic compound) is preferably 0.5 to 10, more preferably 0.5 to 6.0, even more preferably 1.0 to 3.0. A ratio of 0.5 or more results in higher heat resistance and is thus preferred. A ratio of 10 or less results in good formability and is thus preferred.

The ratio of the number of moles of the carboxy groups and so forth of the third aromatic compound to the number of moles of the hydroxy groups of the second aromatic compound (carboxy groups and so forth/hydroxy groups of second aromatic compound) is preferably 0.5 to 10, more preferably 1.5 to 4.0. A ratio of 0.5 or more results in good formability and is thus preferred. A ratio of 10 or less results in higher heat resistance and is thus preferred.

In an embodiment, the structure of the resulting active ester resin can be controlled by controlling the reaction sequence.

The method for producing the active ester resin includes (1) a step of reacting the first aromatic compound with the third aromatic compound and (2) a step of reacting the product obtained in the step (1) and the second aromatic compound. In the production method, the reaction can be controlled after a polyester structure is formed, thus providing the active ester resin having a uniform molecular weight distribution.

Additionally, the structure of the resulting active ester resin can be controlled by controlling reaction conditions.

The pH during the reaction is preferably, but not particularly limited to, 11 or more. In this case, the pH can be adjusted with an acid, such as hydrochloric acid, sulfuric acid, nitric acid, or acetic acid, or a base, such as sodium hydroxide, potassium hydroxide, calcium hydroxide, or ammonia.

The reaction temperature is preferably, but not particularly limited to, 20° C. to 100° C., more preferably 40° C. to 80° C.

The reaction pressure is more preferably, but not particularly limited to, normal pressure.

The reaction time is preferably, but not particularly limited to, 0.5 to 10 hours, more preferably 1 to 5 hours.

<Composition>

According to an embodiment of the present invention, a composition is provided. The composition contains an active ester resin and an epoxy resin. The composition may further contain another resin, a solvent, another curing agent, an additive, and so forth, as needed.

[Active Ester Resin]

As the active ester resin, the active ester resin according to the present invention is contained. The active ester resin has, for example, the function of a curing agent for the epoxy resin.

The active ester resin described above is used; thus, the description thereof is omitted here.

The active ester resin content is preferably, but not particularly limited to, 2% to 80% by mass, more preferably 5% to 70% by mass based on the solid content of the composition. An active ester resin content of 2% or more by mass results in a lower dielectric loss tangent of a cured product thereof and is thus preferred. An active ester resin content of 80% or less by mass results in a good balance between the heat resistance and the dielectric loss tangent of a cured product thereof and is thus preferred. In the present specification, the "solid content of the composition" refers to the total mass of components in the composition excluding the solvent.

In an embodiment, the mass ratio of the amount of the active ester resin used to the amount of the epoxy resin used (active ester resin/epoxy resin) is preferably more than 1.0, more preferably 1.1 to 5.0, even more preferably 1.2 to 3.0. A mass ratio of more than 1.0 results in a lower dielectric loss tangent of a cured product thereof and is thus preferred. Typically, when the amount of the active ester resin used is larger than the amount of the epoxy resin used, the dielectric loss tangent decreases as the amount of the active ester resin used increases relatively. However, the presence of the active ester resin unreacted with the epoxy resin tends to reduce the heat resistance. In contrast, even if the active ester resin according to the embodiment does not react with the epoxy resin, the unsaturated bond-containing substituents themselves form cross-links; thus, the heat resistance of a cured product can be maintained. In other words, the low dielectric loss tangent can be achieved while maintaining the heat resistance of the cured product.

[Another Curing Agent]

In an embodiment, another curing agent may be used together with the active ester resin according to the present invention.

Examples of another curing agent include, but are not particularly limited to, another active ester resin, amine curing agents, imidazole curing agents, acid anhydride curing agents, and phenolic resin curing agents.

An example of another active ester resin described above is, but not particularly limited to, an active ester resin other than the foregoing active ester resins (in this specification, referred to as "another active ester resin"). A specific example of another active ester resin is, but not particularly limited to, an active ester resin that has no unsaturated bond-containing substituent having 2 to 30 carbon atoms.

A specific example thereof include a reaction product of the first aromatic compound that has no unsaturated bond-containing substituent and that has two or more phenolic hydroxy groups as substituents, the second aromatic compound that has no unsaturated bond-containing substituent and that has a phenolic hydroxy group, and the third aromatic compound that has no unsaturated bond-containing substituent and that has two or more carboxy groups as substituents, and/or an acid halide thereof or an esterified compound thereof.

In an embodiment, examples of another active ester compound include compounds represented by chemical formula (8) below.

[Chem. 11]

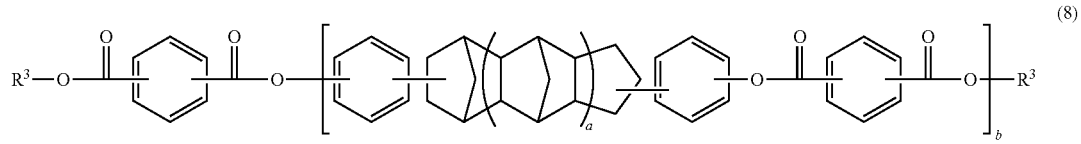

(8)

In chemical formula (8), each $R^3$ is independently phenyl or naphthyl. Each a is independently 0 or 1. b is 1 to 10. In this case, when the compound represented by chemical formula (8) is an oligomer or a polymer, b represents an average value.

Examples of the amine curing agents include, but are not particularly limited to, aliphatic amines, such as diethylenetriamine (DTA), triethylenetetramine (TTA), tetraethylenepentamine (TEPA), dipropylenediamine (DPDA), diethylaminopropylamine (DEAPA), N-aminoethylpiperazine, menthanediamine (MDA), isophoronediamine (IPDA), 1,3-bisaminomethylcyclohexane (1,3-BAC), piperidine, N,N,-dimethylpiperazine, and triethylenediamine; and aromatic amines, such as m-xylenediamine (XDA), methanephenylenediamine (MPDA), diaminodiphenylmethane (DDM), diaminodiphenyl sulfone (DDS), benzylmethylamine, 2-(dimethylaminomethyl)phenol, and 2,4,6-tris(dimethylaminomethyl)phenol.

Examples of the imidazole curing agents include 2-methylimidazole, 2-ethyl-4-methylimidazole, 1-cyanoethyl-2-undecylimidazolium trimellitate, and epoxy-imidazole adducts.

Examples of the acid anhydride curing agents include phthalic anhydride, trimellitic anhydride, pyromellitic anhydride, benzophenonetetracarboxylic dianhydride, ethylene glycol bistrimellitate, glycerol tristrimellitate, maleic anhydride, tetrahydrophthalic anhydride, methyltetrahydrophthalic anhydride, endo-methylenetetrahydrophthalic anhydride, methyl-endo-methylenetetrahydrophthalic anhydride, methylbutenyltetrahydrophthalic anhydride, dodecenylsuccinic anhydride, hexahydrophthalic anhydride, methylhexahydrophthalic anhydride, succinic anhydride, and methylcyclohexenedicarboxylic anhydride.

Examples of the phenolic resin curing agents include phenolic novolac resins, cresol novolac resins, naphthol novolac resins, bisphenol novolac resins, biphenyl novolac resins, dicyclopentadiene phenol addition-type resins, phenol aralkyl resins, naphthol aralkyl resins, triphenolmethane-type resins, tetraphenolethane-type resins, and aminotriazine-modified phenolic resins.

These curing agents described above may be used alone or in combination of two or more.

The amount of another curing agent contained is preferably, but not particularly limited to, 2% to 80% by mass, more preferably 5% to 70% by mass with respect to the active ester resin. When the amount of the curing agent contained is 2% or more by mass, fast curability is also provided, which is preferred. When the amount of the curing agent contained is 80% or less by mass, a cured product also has good mechanical properties, which is preferred.

[Epoxy Resin]

The epoxy resin is a curable resin that contains two or more epoxy groups in its molecule and that can be cured by forming a cross-linked network with the epoxy groups.

Examples of the epoxy resin include, but are not particularly limited to, phenol novolac-type epoxy resins, such as epoxy resins, cresol novolac-type epoxy resins, α-naphthol novolac-type epoxy resins, β-naphthol novolac-type epoxy resins, bisphenol A novolac-type epoxy resins, and biphenyl novolac-type epoxy resins; aralkyl-type epoxy resins, such as phenol aralkyl-type epoxy resins, naphthol aralkyl-type epoxy resins, and phenol biphenylaralkyl-type epoxy resins; bisphenol-type epoxy resins, such as bisphenol A-type epoxy resins, bisphenol AP-type epoxy resins, bisphenol AF-type epoxy resins, bisphenol B-type epoxy resins, bisphenol BP-type epoxy resins, bisphenol C-type epoxy resins, bisphenol E-type epoxy resins, bisphenol F-type epoxy resins, bisphenol S-type epoxy resins, and tetrabromobisphenol A-type epoxy resins; biphenyl-type epoxy resins, such as biphenyl-type epoxy resins, tetramethylbiphenyl-type epoxy resins, and epoxy resins having biphenyl skeletons and diglycidyloxybenzene skeletons; naphthalene-type epoxy resins; binaphthol-type epoxy resins; binaphthyl-type epoxy resins; dicyclopentadiene-type epoxy resins, such as dicyclopentadiene phenol-type epoxy resins; glycidylamine-type epoxy resins, such as tetraglycidyldiaminodiphenylmethane-type epoxy resins, triglycidyl-p-aminophenol-type epoxy resins, and diaminodiphenyl sulfone glycidylamine-type epoxy resins; diglycidyl ester-type epoxy resins, such as diglycidyl 2,6-naphthalenedicarboxylate-type epoxy resins and hexahydrophthalic anhydride glycidyl ester-type epoxy resins; and benzopyran-type epoxy resins, such as dibenzopyran, hexamethyldibenzopyran, and 7-phenylhexamethyldibenzopyran.

Among these, phenol biphenylaralkyl-type epoxy resins, naphthol aralkyl-type epoxy resins, and dicyclopentadiene phenol-type epoxy resins are preferred.

These epoxy resins may be used alone or in combination of two or more.

The epoxy resin preferably has an epoxy equivalent of 150 to 500 g/equivalent (eq.), more preferably 200 to 350 g/equivalent. An epoxy equivalent of the epoxy resin of 150 g/equivalent or more results in higher heat resistance of a cured product to be obtained and is thus preferred. An epoxy equivalent of the epoxy resin of 500 g/equivalent or less results in a better balance between the heat resistance and the dielectric loss tangent of a cured product to be obtained and is thus preferred.

The epoxy resin preferably has a weight-average molecular weight of 200 to 5,000, more preferably 300 to 3,000. A weight-average molecular weight of the epoxy resin of 200 or more also results in fast curability and is thus preferred. A weight-average molecular weight of the epoxy resin of 5,000 or less results in good formability and is thus preferred.

The epoxy resin content is preferably, but not particularly limited to, 2% to 80% by mass, more preferably 5% to 70% by mass with respect to the active ester resin. An epoxy resin content of 2% or more by mass results in good formability and is thus preferred. An epoxy resin content of 80% or less by mass results in a better balance between the dielectric properties and the heat resistance of a cured product and is thus preferred.

[Another Resin]

In an embodiment, the composition may contain another resin. In this specification, the term "another resin" refers to a resin other than the epoxy resin.

Specific examples of another resin include, but are not particularly limited to, maleimide resins, bismaleimide resins, polymaleimide resins, poly(phenylene ether) resins, polyimide resins, cyanate ester resins, benzoxazine resins, triazine-containing cresol novolac resins, cyanic ester resins, cyanic ester resins, styrene-maleic anhydride resins, ally group-containing resins, such as diallyl bisphenol and triallyl isocyanurate, polyphosphate esters, and phosphoric ester-carbonate copolymers. These resins may be used alone or in combination of two or more.

[Solvent]

In an embodiment, the composition may contain a solvent. The solvent has, for example, the function of adjusting the viscosity of the composition.

Specific examples of the solvent include, but are not particularly limited to, ketones, such as acetone, methyl ethyl ketone, and cyclohexanone; esters, such as ethyl acetate, butyl acetate, cellosolve acetate, propylene glycol monomethyl ether acetate, and carbitol acetate; carbitols, such as cellosolve and butyl carbitol; aromatic hydrocarbons, such as toluene and xylene; and amides, such as dimethylformamide, dimethylacetamide, and N-methylpyrrolidone. These solvents may be used alone or in combination of two or more.

The amount of the solvent used is preferably 10% to 80% by mass, more preferably 20% to 70% by mass based on the total mass of the composition. When the amount of the solvent used is 10% or more by mass, good handleability is provided, which is preferred. When the amount of the solvent used is 80% or less by mass, good impregnation properties with another base material are provided, which is preferred.

[Additive]

In an embodiment, the composition may contain an additive. Examples of the additive include curing accelerators, flame retardants, and fillers.

(Curing Accelerator)

Examples of the curing accelerators include, but are not particularly limited to, phosphorus-based curing accelerators, amine-based curing accelerators, imidazole-based curing accelerators, guanidine-based curing accelerators, urea-based curing accelerators, peroxides, and azo compounds.

Examples of the phosphorus-based curing accelerators include, organic phosphine compounds, such as triphenylphosphine, tributylphosphine, tri (p-tolyl)phosphine, diphenylcyclohexylphosphine, and tricyclohexylphosphine; organic phosphite compounds, such as trimethyl phosphite and triethyl phosphite; and phosphonium salts, such as ethyltriphenylphosphonium bromide, benzyltriphenylphosphonium chloride, butylphosphonium tetraphenylborate, tetraphenylphosphonium tetraphenylborate, tetraphenylphosphonium tetra-p-tolylborate, triphenylphosphine-triphenylborane, tetraphenylphosphonium thiocyanate, tetraphenylphosphonium dicyanamide, butylphenylphosphonium dicyanamide, and tetrabutylphosphonium decanoate.

Examples of the amine-based curing accelerators include triethylamine, tributylamine, N,N-dimethyl-4-aminopyridine (DMAP), 2,4,6-tris(dimethylaminomethyl)phenol, 1,8-diazabicyclo[5,4,0]-undecene-7 (DBU), and 1,5-diazabicyclo[4,3,0]-nonene-5 (DBN).

Examples of the imidazole-based curing accelerators include 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, an isocyanuric acid adduct of 2-phenylimidazole, 2-phenyl-4,5-dihydroxymethylimidazole, 2-phenyl-4-methyl-5hydroxymethylimidazole, 2,3-dihydro-1H-pyrrolo[1,2-a]benzimidazole, 1-dodecyl-2-methyl-3-benzylimidazolium chloride, and 2-methylimidazoline.

Examples of the guanidine-based curing accelerators include dicyandiamide, 1-methylguanidine, 1-ethylguanidine, 1-cyclohexylguanidine, 1-phenylguanidine, dimethylguanidine, diphenylguanidine, trimethylguanidine, tetramethylguanidine, pentamethylguanidine, 1,5,7-triazabicyclo[4.4.0]dec-5-ene, 7-methyl-1,5,7-triazabicyclo[4.4.0]dec-5-ene, 1-methylbiguanide, 1-ethylbiguanide, 1-butylbiguanide, 1-cyclohexylbiguanide, 1-allybiguanide, and 1-phenylbiguanide.

Examples of the urea-based curing accelerators include 3-phenyl-1,1-dimethylurea, 3-(4-methylphenyl)-1,1-dimethylurea, chlorophenylurea, 3-(4-chlorophenyl)-1,1-dimethylurea, and 3-(3,4-dichlorophenyl)-1,1-dimethylurea.

Examples of the peroxides and the azo compounds include benzoyl peroxide, p-chlorobenzoyl peroxide, di-tert-butyl peroxide, diisopropyl peroxycarbonate, di-2-ethylhexyl peroxycarbonate, and azobisisobutyronitrile.

Among these curing accelerators, 2-ethyl-4-methylimidazole or dimethylaminopyridine is preferably used.

These curing accelerators described above may be used alone or in combination of two or more.

The amount of the curing accelerator used is preferably 0.01 to 5 parts by mass, more preferably 0.1 to 3 based on 100 parts by mass of the epoxy resin. When the amount of the curing accelerator used is 0.01 parts or more by mass, good curability is obtained, which is preferred. When the amount of the curing accelerator used is 5 parts or less by mass, good formability is obtained, which is preferred.

(Flame Retardant)

Examples of the flame retardants include, but are not particularly limited to, inorganic phosphorus-based flame retardants, organic phosphorus-based flame retardants, and halogen-containing flame retardants.

Examples of the inorganic phosphorus-based flame retardants include, but are not particularly limited to, red phosphorus; ammonium phosphates, such as ammonium phosphate monobasic, ammonium phosphate dibasic, ammonium phosphate tribasic, and ammonium polyphosphate; and phosphoramide.

Examples of the organic phosphorus-based flame retardants include, but are not particularly limited to, phosphoric esters, such as methyl acid phosphate, ethyl acid phosphate, isopropyl acid phosphate, dibutyl phosphate, monobutyl phosphate, butoxyethyl acid phosphate, 2-ethylhexyl acid phosphate, bis(2-ethylhexyl)phosphate, monoisodecyl acid phosphate, lauryl acid phosphate, tridecyl acid phosphate, stearyl acid phosphate, isostearyl acid phosphate, oleyl acid phosphate, butyl pyrophosphate, tetracosyl acid phosphate, ethylene glycol acid phosphate, and (2-hydroxyethyl) methacrylate acid phosphate; diphenylphosphines, such as 9,10-dihydro-9-oxa-10-phosphaphenanthrene-10-oxide and diphenylphosphine oxide; phosphorus-containing phenols, such as 10-(2,5-dihydroxyphenyl)-10H-9-oxa-10-phosphaphenanthrene-10-oxide, 10-(1,4-dioxynaphthalene)-10H-9-oxa-10-phosphaphenanthrene-10-oxide, diphenylphosphinyl hydroquinone, diphenylphosphenyl-1,4-dioxynaphthalene, 1,4-cyclooctylenephosphinyl-1,4-phenyldiol, and 1,5-cyclooctylenephosphinyl-1,4-phenyldiol; cyclic phosphorus compounds, such as 9,10-dihydro-9-oxa-10-phosphaphenanthrene-10-oxide, 10-(2,5-dihydrooxyphenyl)-10H-9-oxa-10-phosphaphenanthrene-10-oxide, and 10-(2,7-dihydrooxynaphthyl)-10H-9-oxa-10-phosphaphenanthrene-10-oxide; and compounds obtained by reacting the phosphoric esters, the diphenylphosphines, or the phosphorus-containing phenols with epoxy resins, aldehyde compounds, or phenol compounds.

Examples of the halogen-containing flame retardants include, but are not particularly limited to, brominated polystyrene, bis(pentabromophenyl)ethane, tetrabromobisphenol A bis(dibromopropyl ether), 1,2-bis(tetrabromophthalimide), 2,4,6-tris(2,4,6-tribromophenoxy)-1,3,5-triazine, and tetrabromophthalic acid.

These flame retardants described above may be used alone or in combination of two or more.

The amount of the flame retardant used is preferably 0.1 to 50 parts by mass, more preferably 1 to 30 based on 100 parts by mass of the epoxy resin. When the amount of the flame retardant used is 0.1 parts or more by mass, flame retardancy can be imparted, which is preferred. When the amount of the flame retardant used is 50 parts or less by mass, flame retardancy can be imparted while maintaining the dielectric properties, which is preferred.

(Filler)

Examples of the fillers include organic fillers and inorganic fillers. The fillers have, for example, the functions of improving elongation and mechanical strength.

Examples of the organic fillers include, but are not particularly limited to, polyamide particles.

Examples of the inorganic fillers include, but are not particularly limited to, silica, alumina, glass, cordierite, silicon oxide, barium sulfate, barium carbonate, aluminum hydroxide, magnesium hydroxide, calcium carbonate, magnesium carbonate, magnesium oxide, boron nitride, aluminum nitride, manganese nitride, aluminum borate, strontium carbonate, strontium titanate, calcium titanate, magnesium titanate, bismuth titanate, titanium oxide, zirconium oxide, barium titanate, barium zirconate titanate, barium zirconate, calcium zirconate, zirconium phosphate, zirconium phosphate tungstate, talc, clay, mica powder, zinc oxide, hydrotalcite, boehmite, and carbon black.

Among these, silica is preferably used. In this case, Examples of silica that can be used include amorphous silica, fused silica, crystalline silica, synthetic silica, and hollow silica.

The fillers described above may be surface-treated as needed. Examples of a surface treatment agent that can be used in this case include, but are not particularly limited to, aminosilane-based coupling agents, epoxysilane-based coupling agents, mercaptosilane-based coupling agents, silane-based coupling agents, organosilazane compounds, and titanate-based coupling agents. Specific examples of the surface treatment agents include 3-glycidoxypropyltrimethoxysilane, 3-mercaptopropyltrimethoxysilane, 3-aminopropyltriethoxysilane, N-phenyl-3-aminopropyltrimethoxysilane, and hexamethyldisilazane.

These fillers described above may be used alone or in combination of two or more.

The average particle size of each of the fillers is preferably, but is not particularly limited to, 0.01 to 10 μm, more preferably 0.03 to 5 μm, even more preferably 0.05 to 3 μm. In the present specification, the "particle size" refers to the maximum distance between two points on the outline of a particle. The "average particle size" refers to a value obtained by a method including measuring the particle sizes of freely-selected 100 particles on one screen in an image with a scanning electron microscope (SEM) and calculating the average value thereof.

The amount of the filler used is preferably 0.5 to 95 parts by mass, more preferably 5 to 80 parts by mass based on 100 parts by mass of the epoxy resin. When the amount of the filler used is 0.5 parts or more by mass, low thermal expansion can be provided, which is preferred. When the amount of the filler used is 95 parts or less by mass, a good balance between characteristics and formability is provided, which is preferred.

<Cured Product (Cured Product of Active Ester Resin)>

According to an embodiment of the present invention, a cured product obtained by curing the active ester resin is provided.

Because the active ester resin described above has an unsaturated bond-containing substituent, it can be homopolymerized to provide a cured product.

The cured product may contain the curing agent, the additive, the curing accelerator, and so forth as needed.

Because the active ester resin itself has a low dielectric loss tangent, a cured product of the resulting homopolymer can also have a low dielectric loss tangent. Thus, the cured product can be suitably used for applications of printed circuit boards and build-up films.

The heating temperature for heat curing is preferably, but not particularly limited to, 150° C. to 300° C., more preferably 175° C. to 250° C.

<Cured Product (Cured Product of Composition)>

According to an embodiment of the present invention, a cured product obtained by curing the composition described above is provided. The cured product has a low dielectric loss tangent and higher heat resistance and thus can be used for electronic material applications of, for example, semiconductor package substrates, printed circuit boards, build-up adhesive films, and semiconductor sealing materials. Additionally, the cured product can also be used for applications of, for example, adhesives and coatings.

The cured product according to this embodiment (the cured product of the composition) can be formed under the same conditions as those for the foregoing cured product (the cured product of the active ester resin).

EXAMPLES

While the present invention will be described below using examples, the present invention is not limited to the description of these examples.

Example 1

Into a flask equipped with a thermometer, a dropping funnel, a condenser, a fractionating column, and a stirrer, 165 g of a resin (hydroxyl equivalent: 165 g/equivalent (eq), softening point: 85° C.) obtained by the polyaddition reaction of dicyclopentadiene and phenol, 134 g (1.0 mol) of o-allylphenol, and 1,200 g of toluene were charged. The system was reduced in pressure and filled with nitrogen. Next, 203 g (1.0 mol) of isophthaloyl chloride was added thereto. The system was reduced in pressure and filled with nitrogen. Then 0.6 g of tetrabutylammonium bromide was added thereto. The system was controlled to 60° C. or lower while nitrogen gas purge treatment was performed, and 412 g of a 20% aqueous solution of sodium hydroxide was added dropwise thereto over a period of 3 hours. After the dropwise addition, the mixture was stirred for 1.0 hour. After completion of the reaction, the mixture was allowed to stand. Liquid separation was performed to remove the aqueous layer. Water was added to the resulting toluene layer. The mixture was stirred for 15 minutes and then allowed to stand. Liquid separation was performed to remove the aqueous layer. This operation was repeated until the pH of the aqueous layer reached 7. Drying was performed by heating under reduced pressure to provide an active ester resin represented by the following chemical formula.

[Chem. 12]

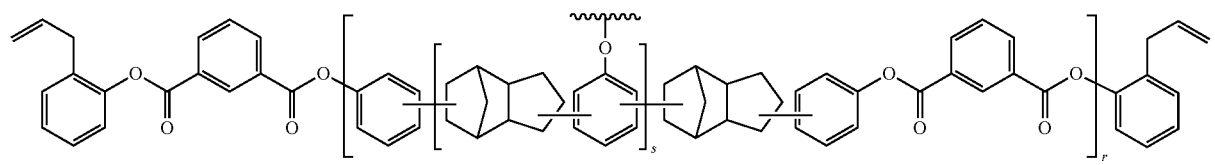

In the chemical formula, each s is independently an integer of 0 or 1 or more. The average value of r calculated from the feed ratio is 1. A broken line in the chemical formula represents a structure obtained by the reaction of isophthaloyl chloride with o-allylphenol and/or the resin obtained by polyaddition reaction of phenol.

The ester equivalent of the resulting active ester resin was calculated from the feed ratio and found to be 214 g/equivalent (eq.).

The softening point of the active ester resin was measured by a B & R method and found to be 82° C.

FIG. 1 is a GPC chart of the resulting active ester resin. The number-average molecular weight (Mn) was 798.

Example 2

An active ester resin represented by the following chemical formula was prepared in the same method as in Example 1, except that 160 g (1.0 mol) of diallyl bisphenol A was used in place of the resin obtained by the polyaddition reaction of dicyclopentadiene and phenol.

[Chem. 13]

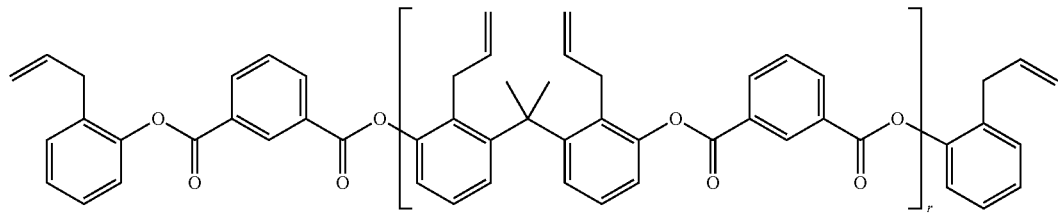

In the chemical formula, the average value of r calculated from the feed ratio is 1.

The ester equivalent and the softening point of the active ester resin were calculated and measured in the same methods as in Example 1 and found to be 212 g/equivalent (eq.) and 51° C., respectively.

Figure 2:
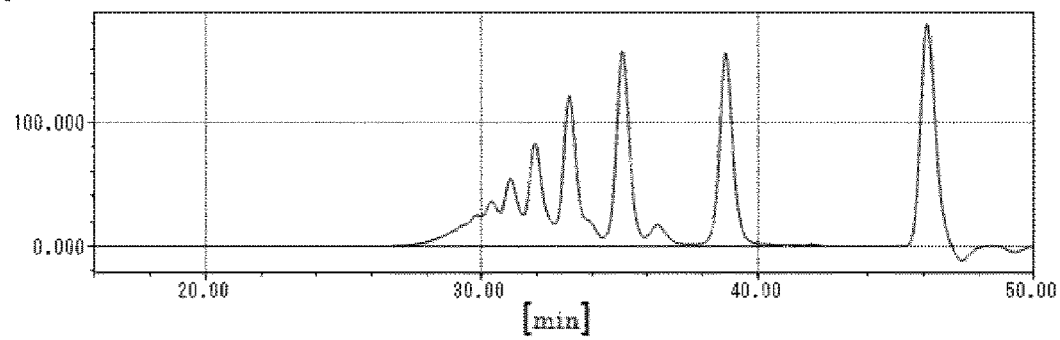
FIG. 2 is a GPC chart of an active ester resin obtained in Example 2.

FIG. 2 is a GPC chart of the resulting active ester resin. The number-average molecular weight (Mn) was 851.

Example 3

Into a flask equipped with a thermometer, a dropping funnel, a condenser, a fractionating column, and a stirrer, 202 g of phenol biphenylaralkyl-type resin (hydroxyl equivalent: 202 g/eq), 268 g (2.0 mol) of o-allylphenol, and 1,200 g of toluene were charged. The system was reduced in pressure and filled with nitrogen. Next, 305 g (1.5 mol) of isophthaloyl chloride was added thereto. The system was reduced in pressure and filled with nitrogen. Then 0.6 g of tetrabutylammonium bromide was added thereto. The system was controlled to 60° C. or lower while nitrogen gas purge treatment was performed, and 618 g of a 20% aqueous solution of sodium hydroxide was added dropwise thereto over a period of 3 hours. After the dropwise addition, the mixture was stirred for 1.0 hour. After completion of the reaction, purification was performed in the same way as in Example 1 to give an active ester resin represented by the following chemical formula.

[Chem. 14]

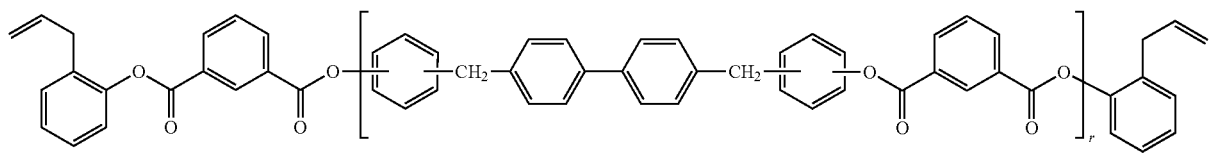

In the chemical formula, the average value of r calculated from the feed ratio is 0.5.

The ester equivalent and the softening point of the active ester resin were measured in the same methods as in Example 1 and found to be 221 g/equivalent (eq.) and 56° C., respectively.

Figure 3:
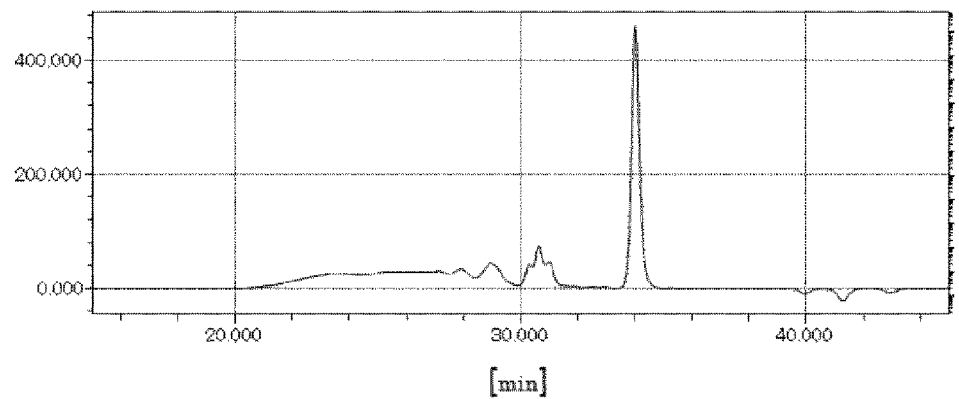
FIG. 3 is a GPC chart of an active ester resin obtained in Example 3.

FIG. 3 is a GPC chart of the resulting active ester resin. The number-average molecular weight (Mn) was 662.

Example 4

Into a flask equipped with a thermometer, a dropping funnel, a condenser, a fractionating column, and a stirrer, 216 g (1.5 mol) of 1-naphthol, 300 g of toluene, and 315 g (1.6 mol) of a 20% aqueous solution of sodium hydroxide were charged. The mixture was heated to 80° C. under stirring. Next, 115 g (1.5 mol) of allyl chloride was added dropwise thereto over a period of 3 hours. After completion of the reaction, the mixture was washed three times with 200 parts by mass of water each time. Toluene and so forth were evaporated by heating under reduced pressure to provide an allylnaphthol compound.

The hydroxyl equivalent of the resulting allylnaphthol compound was measured by an acetylation method. As a result, the hydroxyl equivalent of the allylnaphthol compound was found to be 188 g/equivalent (eq.).

An active ester resin represented by the following chemical formula was prepared in the same method as in Example 1, except that 188 g (1.0 mol) of the allylnaphthol compound obtained above was used in place of o-allylphenol.

[Chem. 15]

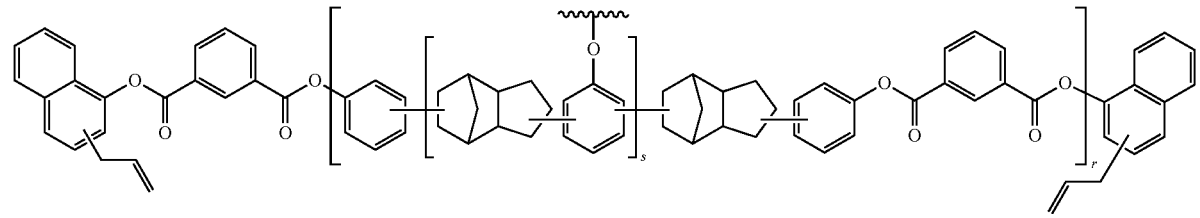

In the chemical formula, each s is independently an integer of 0 or 1 or more. The average value of r calculated from the feed ratio is 1. A broken line in the chemical formula represents a structure obtained by the reaction of isophthaloyl chloride with allylnaphthol and/or the resin obtained by polyaddition reaction of phenol.

The ester equivalent and the softening point of the active ester resin were calculated and measured in the same methods as in Example 1 and found to be 241 g/equivalent (eq.) and 114° C., respectively.

Figure 4:
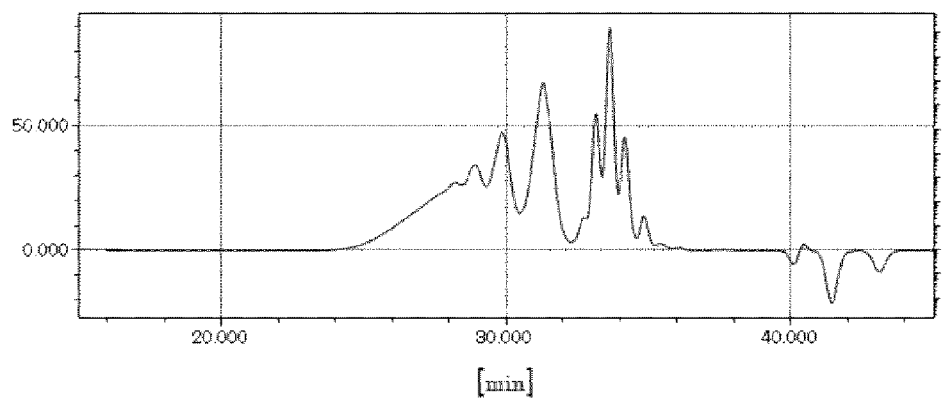
FIG. 4 is a GPC chart of an active ester resin obtained in Example 4.

FIG. 4 is a GPC chart of the resulting active ester resin. The number-average molecular weight (Mn) was 671.

Example 5

An active ester resin represented by the following chemical formula was prepared in the same method as in Example 1, except that 152 g (1.0 mol) of di-1-propenyl bisphenol F was used in place of dicyclopentadiene and the resin obtained by the polyaddition reaction of phenol.

[Chem. 16]

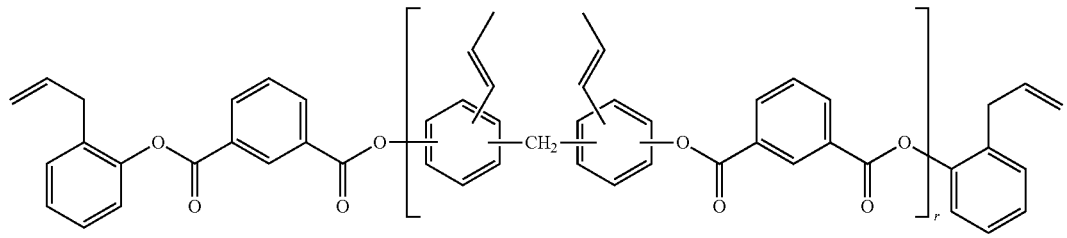

In the chemical formula, the average value of r calculated from the feed ratio is 1.

The ester equivalent and the softening point of the active ester resin were calculated and measured in the same methods as in Example 1 and found to be 213 g/equivalent (eq.) and 106° C., respectively.

Figure 5:
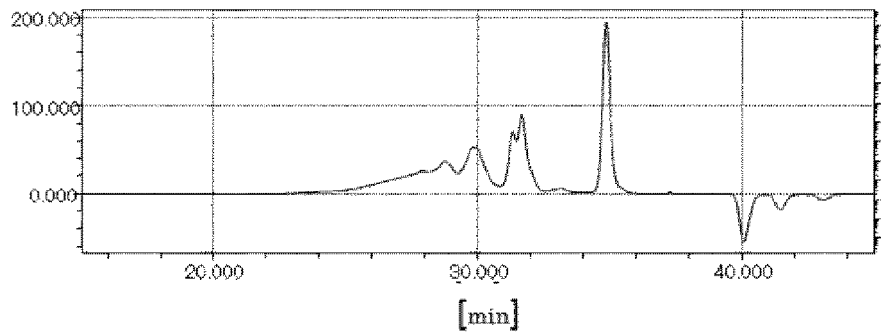
FIG. 5 is a GPC chart of an active ester resin obtained in Example 5.

FIG. 5 is a GPC chart of the resulting active ester resin. The number-average molecular weight (Mn) was 535.

Comparative Example 1

Into a flask equipped with a thermometer, a dropping funnel, a condenser, a fractionating column, and a stirrer, 165 g (1 mol) of a resin (hydroxyl equivalent: 165 g/eq, softening point: 85° C.) obtained by the polyaddition reaction of dicyclopentadiene and phenol, 72 g (0.5 mol) of 1-naphthol, and 630 g of toluene were charged. The system was reduced in pressure and filled with nitrogen. Next, 152 g (0.75 mol) of isophthaloyl chloride was added thereto. The system was reduced in pressure and filled with nitrogen. Then 0.6 g of tetrabutylammonium bromide was added thereto. The system was controlled to 60° C. or lower while nitrogen gas purge treatment was performed, and 315 g of a 20% aqueous solution of sodium hydroxide was added dropwise thereto over a period of 3 hours. After the dropwise addition, the mixture was stirred for 1.0 hour. After completion of the reaction, purification was performed in the same way as in Example 1 to give an active ester resin represented by the following chemical formula.

[Chem. 17]

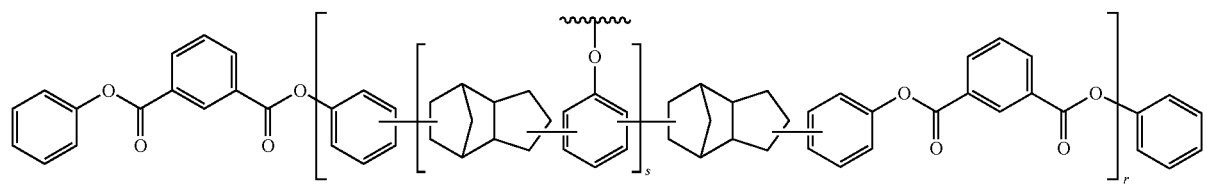

In the chemical formula, each s is independently an integer of 0 or 1 or more. The average value of r calculated from the feed ratio is 2.

The ester equivalent and the softening point of the active ester resin were calculated and measured in the same methods as in Example 1 and found to be 223 g/equivalent (eq.) and 150° C., respectively.

[Evaluation]

The heat resistance, the dielectric loss tangent, and the adhesion of the active ester resins produced in Examples 1 to 5 and Comparative example 1 were evaluated.

(Preparation of Evaluation Sample)

Compositions 1 to 6 were produced according to proportions described in Table 1 below. As an epoxy resin, HP-7200H (dicyclopentadiene phenol-type epoxy resin, epoxy equivalent: 277 g/equivalent (eq.), available from DIC Corporation) was used. As a curing catalyst, dimethylaminopyridine (DMAP) was used. Numbers in the table are based on mass.

TABLE 1

|  | Active ester resin | | Amount of epoxy resin used | Amount of curing catalyst used |
|---|---|---|---|---|
|  | Type | Amount used |  |  |
| Composition 1 | Example 1 | 53.2 | 46.8 | 0.5 |
| Composition 2 | Example 2 | 53.0 | 47.0 | 0.5 |
| Composition 3 | Example 3 | 54.0 | 46.0 | 0.5 |
| Composition 4 | Example 4 | 56.2 | 43.8 | 0.5 |
| Composition 5 | Example 5 | 53.1 | 46.9 | 0.5 |
| Composition 6 | Comparative example 1 | 543 | 45.7 | 0.5 |

Each of the resulting compositions 1 to 6 was poured into a mold (11 cm×9 cm×2.4 mm) and heated at 180° C. for 20 minutes with a press. The resulting molded article was removed from the mold and cured at 175° C. for 5 hours and then 250° C. for 2 hours. Thereby, cured products 1 to 6 (evaluation samples) were produced.

(Heat Resistance)

Each evaluation sample (thickness: 2.4 mm) was cut into a test piece having a width of 5 mm and a length of 54 mm. The test piece was subjected to dynamic mechanical analysis (DMA) using a rectangular tension method with an RSA II solid viscoelasticity measuring instrument (available from Rheometric Scientific) to measure a temperature at the point of change in elastic modulus (a large rate of change of tan δ). When multiple points of change in elastic modulus were measured, the highest temperature was evaluated as heat resistance. The measurement was performed at a frequency of 1 Hz and a rate of temperature increase of 3° C./min. Table 2 presents the results.

(Dielectric Loss Tangent)

The dielectric loss tangent was measured by a resonant cavity method with an E8362C network analyzer (available from Agilent Technologies, Inc). Specifically, each evaluation sample was dried by heating in vacuum at 105° C. for 2 hours and stored in a room at a temperature of 23° C. and a humidity of 50% for 24 hours, and then the dielectric loss tangent thereof was measured at 1 GHz. Table 2 presents the results.

(Adhesion)

As copper foil, "JTC foil" (18 μm), available from JX Nippon Mining & Metals Corp., was used. Each of the compositions 1 to 6 was poured into a mold (11 cm×9 cm×2.4 mm) and heated at 180° C. for 20 minutes with a press. The resulting molded article was removed from the mold and cured at 175° C. for 5 hours and then 250° C. for 2 hours. Thereby, samples for evaluation of adhesion were produced. The resulting resin boards were cut into test pieces each having a width of 10 mm and a length of 200 mm. The adhesion of each test piece to the copper foil was measured in accordance with JIS-6911 and evaluated according to the following criteria. Table 2 presents the results.

⊙: more than 1.3 kN/m
○: more than 1.0 and 1.3 kN/m or less
Δ: more than 0.8 and 1.0 kN/m or less
x: 0.8 kN/m or less

TABLE 2

|  | Active ester resin | Heat resistance | Dielectric loss tangent | Adhesion |
|---|---|---|---|---|
| Cured product 1 | Example 1 | 196 | 0.0070 | ⊙ |
| Cured product 2 | Example 2 | 225 | 0.0072 | Δ |
| Cured product 3 | Example 3 | 210 | 0.0068 | ○ |
| Cured product 4 | Example 4 | 194 | 0.0067 | ⊙ |
| Cured product 5 | Example 5 | 176 | 0.0068 | Δ |
| Cured product 6 | Comparative example 1 | 157 | 0.0080 | ⊙ |

The results presented in Table 2 indicate that the cured products 1 to 6 using the active ester resins of Examples 1 to 5 have higher heat resistance and lower dielectric loss tangents than the cured product 6 using the active ester resin of Comparative example 1.

The invention claimed is:

1. An active ester resin that is a reaction product of:
   a first aromatic compound having two or more phenolic hydroxy groups;
   a second aromatic compound having only one phenolic hydroxy group; and
   a third aromatic compound having two or more carboxy groups and/or an acid halide thereof or an esterified compound thereof,
   wherein at least one of the first aromatic compound, the second aromatic compound, and the third aromatic compound and/or the acid halide thereof or the esterified compound thereof has an unsaturated bond-containing substituent,
   wherein at least the second aromatic compound has an unsaturated bond-containing substituent, and
   wherein the unsaturated bond-containing substituent is an alkenyl or alkynyl group of 2 to 30 carbon atoms.

2. The active ester resin according to claim 1, wherein the first aromatic compound is represented by chemical formula (1):

(1)

wherein, in chemical formula (1),
each $Ar^1$ is independently a substituted or unsubstituted first aromatic ring group,
each $Ar^2$ is independently a substituted or unsubstituted second aromatic ring group,
each X is independently an oxygen atom, a sulfur atom, a substituted or unsubstituted alkylene, a substituted or unsubstituted cycloalkylene, or a substituted or unsubstituted aralkylene, and
n is 0 to 10, wherein at least two hydrogen atoms of $Ar^1$ and $Ar^2$ are replaced with hydroxy groups.

3. The active ester resin according to claim 2, wherein each X is a substituted or unsubstituted cycloalkylene having 3 to 20 carbon atoms or a substituted or unsubstituted aralkylene having 8 to 20 carbon atoms.

4. The active ester resin according to claim 1, wherein the second aromatic compound is a fused ring aromatic compound.

5. A composition, comprising the active ester resin according to claim 1 and an epoxy resin.

6. A cured product obtained by curing the composition according to claim 5.

7. A printed circuit board obtained using the composition according to claim 5.

8. A semiconductor sealing material obtained using the composition according to claim 5.

9. A build-up film obtained using the composition according to claim 5.

10. A cured product obtained by curing the active ester resin according to claim 1.

* * * * *